(12) United States Patent
Dang

(10) Patent No.: US 12,453,237 B2
(45) Date of Patent: Oct. 21, 2025

(54) LIGHT-EMITTING SUBSTRATES AND METHOD FOR MANUFACTURING LIGHT-EMITTING SUBSTRATE, LIGHT-EMITTING APPARATUSES AND DRIVING METHODS THEREFOR

(71) Applicant: BOE TECHNOLOGY GROUP CO., LTD., Beijing (CN)

(72) Inventor: Wenhui Dang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/915,547

(22) PCT Filed: Dec. 1, 2021

(86) PCT No.: PCT/CN2021/134780
§ 371 (c)(1),
(2) Date: Sep. 29, 2022

(87) PCT Pub. No.: WO2023/097558
PCT Pub. Date: Jun. 8, 2023

(65) Prior Publication Data
US 2024/0224577 A1    Jul. 4, 2024

(51) Int. Cl.
*H10K 50/816* (2023.01)
*G09G 3/3225* (2016.01)
(Continued)

(52) U.S. Cl.
CPC ......... *H10K 50/816* (2023.02); *G09G 3/3225* (2013.01); *H10K 50/813* (2023.02);
(Continued)

(58) Field of Classification Search
None
See application file for complete search history.

(56) References Cited

U.S. PATENT DOCUMENTS

2020/0295304 A1    9/2020    Naganuma

FOREIGN PATENT DOCUMENTS

| CN | 101378100 A | 3/2009 |
|---|---|---|
| CN | 105810717 A | 7/2016 |

(Continued)

*Primary Examiner* — Anthony Ho
(74) *Attorney, Agent, or Firm* — XSENSUS LLP

(57) ABSTRACT

A light-emitting substrate includes a substrate and a plurality of sub-pixels disposed on the substrate. Each sub-pixel includes a light-emitting device; the light-emitting device includes a first electrode and a second electrode, and a light-emitting functional layer disposed between the first electrode and the second electrode the light-emitting functional layer includes a light-emitting layer, a first semiconductor layer disposed between the light-emitting layer and the first electrode and in contact with the first electrode, and a second semiconductor layer disposed between the light-emitting layer and the second electrode. The first electrode is configured to provide carriers for the light-emitting layer. In the light-emitting device, a portion of the first electrode in contact with the first semiconductor layer is provided with a hollow therein, and the hollow is located in a region where a sub-pixel to which the light-emitting device belongs is located.

20 Claims, 9 Drawing Sheets

(51) Int. Cl.
*H10K 50/813* (2023.01)
*H10K 71/60* (2023.01)
*H10K 102/10* (2023.01)

(52) U.S. Cl.
CPC ....... *H10K 71/60* (2023.02); *H10K 2102/102* (2023.02); *H10K 2102/103* (2023.02)

(56) References Cited

FOREIGN PATENT DOCUMENTS

| | | |
|---|---|---|
| CN | 113314623 A | 8/2021 |
| JP | 2020-149816 A | 9/2020 |

01

LIGHT-EMITTING SUBSTRATES AND METHOD FOR MANUFACTURING LIGHT-EMITTING SUBSTRATE, LIGHT-EMITTING APPARATUSES AND DRIVING METHODS THEREFOR

CROSS-REFERENCE TO RELATED APPLICATION

This application is a national phase entry under 35 USC 371 of International Patent Application No. PCT/CN2021/134780, filed on Dec. 1, 2021, which is incorporated herein by reference in its entirety.

TECHNICAL FIELD

The present disclosure relates to the field of lighting and display technologies, and in particular, to light-emitting substrates and a method for manufacturing a light-emitting substrate, light-emitting apparatuses and driving methods therefor.

BACKGROUND

Compared with a liquid crystal display (LCD) which emits light passively and uses a light-emitting diode (LED) backlight to display images, a self-luminous light-emitting device may emit light by itself, have a better color performance and a wider viewing angle, and be suitable for manufacturing a lighter and thinner display product. In addition, the self-luminous light-emitting devices may be fabricated into curved display products and flexible display products. These are advantages that traditional backlight display technology cannot achieve.

SUMMARY

In a first aspect, a light-emitting substrate is provided. The light-emitting substrate includes a substrate and a plurality of sub-pixels disposed on the substrate. Each sub-pixel includes a light-emitting device. The light-emitting device includes a first electrode and a second electrode, and a light-emitting functional layer disposed between the first electrode and the second electrode. The light-emitting functional layer includes a light-emitting layer, a first semiconductor layer disposed between the light-emitting layer and the first electrode and in contact with the first electrode, and a second semiconductor layer disposed between the light-emitting layer and the second electrode. The first electrode is configured to provide carriers for the light-emitting layer. In the light-emitting device, a portion of the first electrode in contact with the first semiconductor layer is provided with a hollow therein, and the hollow is located in a region where a sub-pixel to which the light-emitting device belongs is located.

In some embodiments, an area of the first electrode included in the light-emitting device is smaller than an area of the light-emitting layer included in the light-emitting device.

In some embodiments, the first electrode is in ohmic contact with the first semiconductor layer.

In some embodiments, a material of the first semiconductor layer is a metal oxide semiconductor material.

In some embodiments, the carriers provided by the first electrode are electrons. A work function of a material of the first electrode is smaller than a work function of a material of the first semiconductor layer.

In some embodiments, the material of the first electrode is selected from at least one of silver or aluminum, and the material of the first semiconductor layer is selected from at least one of zinc oxide (ZnO), zinc magnesium oxide (ZnMgO), titanium dioxide ($TiO_2$), tin dioxide ($SnO_2$) or zinc tin oxide (ZnSnO).

In some embodiments, the carriers provided by the first electrode are holes. A work function of a material of the first electrode is greater than a work function of a material of the first semiconductor layer.

In some embodiments, the material of the first electrode is selected from at least one of indium tin oxide (ITO), indium zinc oxide (IZO), palladium or platinum, and the material of the first semiconductor layer is selected from at least one of nickel oxide (NiO), tungsten trioxide ($WO_3$) or molybdenum oxide ($MoO_x$).

In some embodiments, the light-emitting substrate further includes a third electrode disposed in the hollow, the third electrode and the first electrode have a gap therebetween, and the third electrode is in Schottky contact with the first semiconductor layer.

In some embodiments, the carriers provided by the first electrode are electrons, and a work function of a material of the third electrode is greater than a work function of a material of the first semiconductor layer. Alternatively, the carriers provided by the first electrode are holes, and the work function of the material of the third electrode is smaller than the work function of the material of the first semiconductor layer.

In some embodiments, the third electrode is configured to receive a second voltage; and the second voltage is configured to adjust an effective width of the first electrode, the effective width of the first electrode is a width of a conductive path that the first electrode is capable of providing for the carriers injection into the light-emitting layer.

In some embodiments, the first electrode included in the light-emitting device includes a plurality of first tooth-shaped sub-electrodes arranged at intervals sequentially in a first direction, the first direction is parallel to a plane where the substrate is located; the plurality of first tooth-shaped sub-electrodes are configured to receive a first voltage, and the hollow is provided between any two adjacent first tooth-shaped sub-electrodes. The third electrode includes a plurality of second tooth-shaped sub-electrodes arranged at intervals sequentially in the first direction; each second tooth-shaped sub-electrode is located between two adjacent first tooth-shaped sub-electrodes, or each first tooth-shaped sub-electrode is located between two adjacent second tooth-shaped sub-electrodes. Each second tooth-shaped sub-electrode and any first tooth-shaped sub-electrode adjacent to the second tooth-shaped sub-electrode have a first gap therebetween, the first gap belongs to the gap.

In some embodiments, a width of a first tooth-shaped sub-electrode in the first direction and a width of a second tooth-shaped sub-electrode in the first direction are both smaller than 100 μm, and the first gap is smaller than 10 μm.

In some embodiments, the plurality of first tooth-shaped sub-electrodes are each in a strip shape and extend in a second direction, the plurality of second tooth-shaped sub-electrodes are each in another strip shape and extend in the second direction. The second direction is parallel to the plane where the substrate is located and perpendicular to the first direction.

In some embodiments, the first electrode further includes a first shank-shaped sub-electrode, the first shank-shaped sub-electrode is disposed at a side of the plurality of first tooth-shaped sub-electrodes in the second direction and in contact with ends of the plurality of first tooth-shaped sub-electrodes proximate to the first shank-shaped sub-electrode. The first shank-shaped sub-electrode is configured to receive the first voltage, so as to provide the plurality of first tooth-shaped sub-electrodes with the first voltage. The third electrode further includes a second shank-shaped sub-electrode, the second shank-shaped sub-electrode is disposed at a side of the plurality of second tooth-shaped sub-electrodes in the second direction and in contact with ends of the plurality of second tooth-shaped sub-electrodes proximate to the second shank-shaped sub-electrode. The second shank-shaped sub-electrode is configured to receive the second voltage, so as to provide the third electrode with the second voltage.

In some embodiments, the second shank-shaped sub-electrode and the first shank-shaped sub-electrode are respectively located at two opposite sides of both the plurality of first tooth-shaped sub-electrodes and the plurality of second tooth-shaped sub-electrodes in the second direction. The second shank-shaped sub-electrode and the ends of the plurality of first tooth-shaped sub-electrodes away from the first shank-shaped sub-electrode each have a second gap therebetween. The first shank-shaped sub-electrode and the ends of the plurality of second tooth-shaped sub-electrodes away from the second shank-shaped sub-electrode each have a third gap therebetween.

In some embodiments, the second gap is larger than or equal to 1 µm and smaller than or equal to 10 µm, and the third gap is larger than or equal to 1 µm and smaller than or equal to 10 µm.

In some embodiments, the first electrode is closer to the substrate than the second electrode is; the hollow is filled with a semiconductor material, and the semiconductor material is same as a material of the first semiconductor layer. Alternatively, the first electrode is further away from the substrate than the second electrode is.

In some embodiments, a material of the light-emitting layer is a quantum dot light-emitting material.

In a second aspect, a light-emitting substrate is provided. The light-emitting substrate includes a substrate and a plurality of sub-pixels disposed on the substrate. Each sub-pixel includes a light-emitting device. The light-emitting device includes a first electrode and a second electrode, and a light-emitting functional layer disposed between the first electrode and the second electrode. The first electrode is closer to the substrate than the second electrode is, the first electrode includes a first pattern and a second pattern disposed in a same layer, and a bandgap of a material of the first pattern is different from a bandgap of a material of the second pattern.

In a third aspect, a light-emitting apparatus is provided. The light-emitting apparatus includes the above light-emitting substrate in the first aspect.

In a fourth aspect, a driving method for the light-emitting apparatus is provided. The driving method includes:

in a light-emitting period of the light-emitting device in the light-emitting substrate included in the light-emitting apparatus, applying a first voltage to the first electrode of the light-emitting device and applying a third voltage to the second electrode of the light-emitting device, so as to drive the light-emitting device to emit light.

In some embodiments, the light-emitting device further includes a third electrode, and the driving method further includes:

in the light-emitting period of the light-emitting device, applying a second voltage to the third electrode to adjust an effective width of the first electrode, the effective width of the first electrode being a width of a conductive path that the first electrode is capable of providing for the carriers injection into the light-emitting layer included in the light-emitting device.

In some embodiments, the carriers provided by the first electrode are electrons, the second voltage is a negative voltage, and an absolute value of the second voltage is smaller than an absolute value of the first voltage. Alternatively, the carriers provided by the first electrode are holes, the second voltage is a positive voltage, and the absolute value of the second voltage is greater than the absolute value of the first voltage.

In a fifth aspect, another light-emitting apparatus is provided. The another light-emitting apparatus includes the above light-emitting substrate in the second aspect.

In a sixth aspect, another driving method for the another light-emitting apparatus is provided. The driving method includes:

in a light-emitting period of the light-emitting device in the light-emitting substrate included in the light-emitting apparatus, applying a first voltage to the first electrode of the light-emitting device and applying a third voltage to the second electrode of the light-emitting device, so as to drive the light-emitting device to emit light.

In a seventh aspect, a method for manufacturing a light-emitting substrate is provided. The method includes:

forming a plurality of sub-pixels on a substrate, wherein each sub-pixel includes a light-emitting device; the light-emitting device includes a first electrode and a second electrode, and a light-emitting functional layer formed between the first electrode and the second electrode; the light-emitting functional layer includes a light-emitting layer, a first semiconductor layer formed between the light-emitting layer and the first electrode and in contact with the first electrode, and a second semiconductor layer formed between the light-emitting layer and the second electrode. In the light-emitting device, a hollow is formed in a portion of the first electrode in contact with the first semiconductor layer, and the hollow is located in a region where a sub-pixel to which the light-emitting device belongs is located.

In some embodiments, forming the plurality of sub-pixels on the substrate includes: forming first electrodes included in all light-emitting devices each in a region where each sub-pixel is located on the substrate through a patterning process, so as to form a hollow in the first electrode included in the light-emitting device and in the region where the sub-pixel to which the first electrode belongs is located.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal to which the embodiments of the present disclosure relate.

DETAILED DESCRIPTION

Figure 1A:
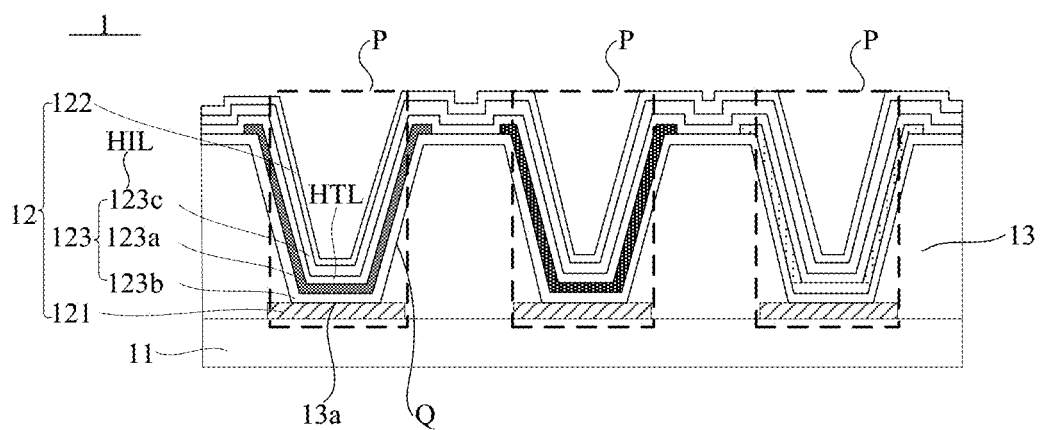
FIG. 1A is a sectional view showing a structure of a light-emitting substrate, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the term such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms "first" and "second" are only used for descriptive purpose, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive language, which does not exclude devices that are applicable to or configured to perform additional tasks or steps.

In addition, the use of the phrase "base on" is meant to be open and inclusive, since a process, step, calculation or other action that is "based on" one or more of the stated conditions or values may, in practice, be based on additional conditions or values exceeding those stated.

Exemplary embodiments are described herein with reference to sectional views and/or plan views as idealized exemplary drawings. In the accompanying drawings, thickness of layers and size of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Figure 3:
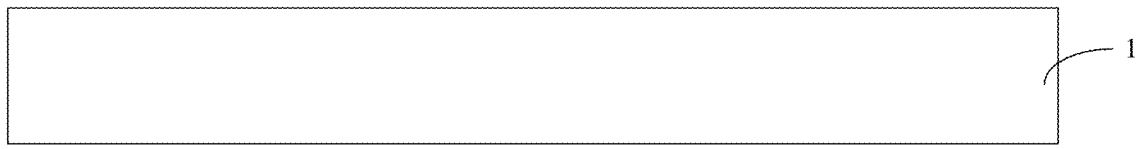
FIG. 3 is a diagram showing a structure of a light-emitting apparatus, in accordance with some embodiments.

Some embodiments of the present disclosure provide a light-emitting apparatus. As shown in FIG. 3, the light-emitting apparatus 01 includes a light-emitting substrate 1. Of course, the light-emitting apparatus may further include other components. For example, the light-emitting apparatus may include a circuit that is used to provide electrical signals for the light-emitting substrate to drive the light-emitting substrate to emit light, and the circuit may be referred to as a control circuit which may include a circuit board electrically connected to the light-emitting substrate and/or an integrated circuit (IC) electrically connected to the light-emitting substrate.

In some embodiments, the light-emitting apparatus may be an illumination apparatus. In this case, the light-emitting apparatus is used as a light source to achieve a lighting function. For example, the light-emitting apparatus may be a backlight module of a liquid crystal display apparatus, a light used for internal or external lighting, or one of various signaling lights.

In some other embodiments, the light-emitting apparatus may be a display apparatus. In this case, the light-emitting substrate is a display substrate used to achieve an image (i.e., picture) display function. The light-emitting apparatus may include a display or a product including a display. The display may be a flat panel display (FPD) or a microdisplay, etc. According to whether users may see scenes at back of the display, the display may be a transparent display or a non-transparent display. According to whether the display can be bent or rolled, the display may be a flexible display or a general display (which may be referred to as a rigid display). For example, the product including the display may be a computer monitor, a television, a billboard, a laser printer with a display function, a telephone, a mobile phone, a personal digital assistant (PDA), a laptop computer, a digital camera, a camcorder, a viewfinder, a vehicle, a large-area wall, a theater screen or a stadium sign, etc.

Some embodiments of the present disclosure provide a light-emitting substrate. As shown in FIGS. 1A to 1D, the light-emitting substrate 1 includes a substrate 11, and a plurality of sub-pixels P disposed on the substrate 11. Each sub-pixel P includes a light-emitting device 12 disposed on the substrate 11. Each light-emitting device 12 includes a first electrode 121, a second electrode 122, and a light-emitting functional layer 123 disposed between the first electrode 121 and the second electrode 122. The light-emitting functional layer 123 includes a light-emitting layer 123a. For example, a material of the light-emitting layer 123a is a quantum dot light-emitting material.

In some embodiments, the first electrode 121 may be an anode, and in this case, the second electrode 122 is a cathode. In some other embodiments, the first electrode 121 may be the cathode, and in this case, the second electrode 122 is the anode.

A light-emitting principle of the light-emitting device 12 is as follows: through a circuit connected to the anode and the cathode, holes are injected into the light-emitting layer 123a by the anode, electrons are injected into the light-emitting layer 123a by the cathode, and excitons are produced in the light-emitting layer 123a by the electrons and the holes; the excitons return to a ground state through radiative transition, and photons are emitted.

As shown in FIGS. 1A to 1D, in order to improve efficiency of the electrons and the holes being injected into the light-emitting layer, the light-emitting functional layer 123 may further include a first semiconductor layer 123b disposed between the light-emitting layer 123a and the first electrode 121 and in contact with the first electrode 121, and a second semiconductor layer 123c disposed between the light-emitting layer 123a and the second electrode 122.

The first semiconductor layer 123b may be an electron transport layer (ETL), and the second semiconductor layer 123c may be a hole transport layer (HTL). Alternatively, the first semiconductor layer 123b may be the hole transport layer (HTL), and the second semiconductor layer 123c may be the electron transport layer (ETL). Alternatively, the first semiconductor layer 123b may be an electron injection layer (EIL), and the second semiconductor layer 123c may include a hole injection layer (HIL) and the hole transport layer (HTL). Alternatively, the first semiconductor layer 123b may be the hole injection layer (HIL), and the second semiconductor layer 123c may include the electron injection layer (EIL) and the electron transport layer (ETL).

Of course, in a case where the first semiconductor layer 123b is the electron injection layer (EIL), the electron transport layer (ETL) may be provided between the first semiconductor layer 123b and the light-emitting layer 123a. In a case where the first semiconductor layer 123b is the hole injection layer (HIL), the hole transport layer (HTL) may be provided between the first semiconductor layer 123b and the light-emitting layer 123a.

Moreover, the light-emitting functional layer 123 may further include a hole blocking layer and an electron blocking layer in addition to the electron injection layer (EIL), the hole injection layer (HIL), the electron transport layer (ETL) and the hole transport layer (HTL). The hole blocking layer may be disposed between the electron transport layer (ETL) and the light-emitting layer 123a, and the electron blocking layer may be disposed between the hole transport layer (HTL) and the light-emitting layer 123a. The hole blocking layer may have a deep highest occupied molecular orbital (HOMO) and a shallow lowest unoccupied molecular orbital (LUMO), which facilitates electrons transport and blocks holes transport. Similarly, the electron blocking layer may have a deep LUMO and a shallow HOMO, which facilitates the holes transport and blocks the electrons transport. As a result, it is possible to adjust injection of carriers (electrons and holes) into the light-emitting layer 123a, so that a recombination region of the electrons and the holes may be confined in the light-emitting layer 123a.

Figure 1B:
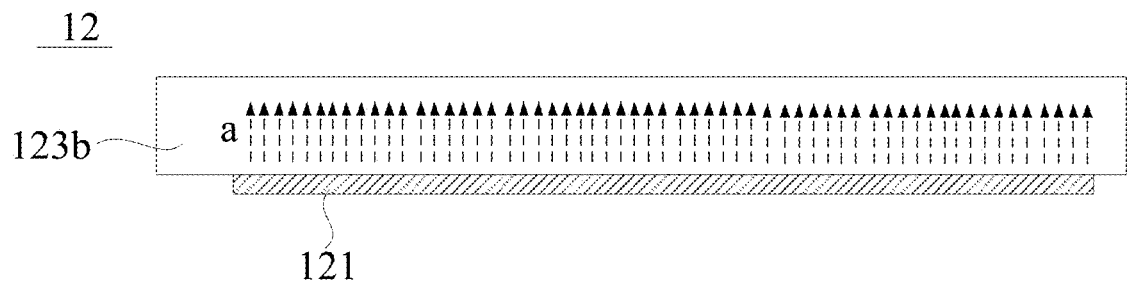
FIG. 1B is a diagram showing carriers in the light-emitting device shown in FIG. 1A transporting in a first semiconductor layer.
Figure 1C:
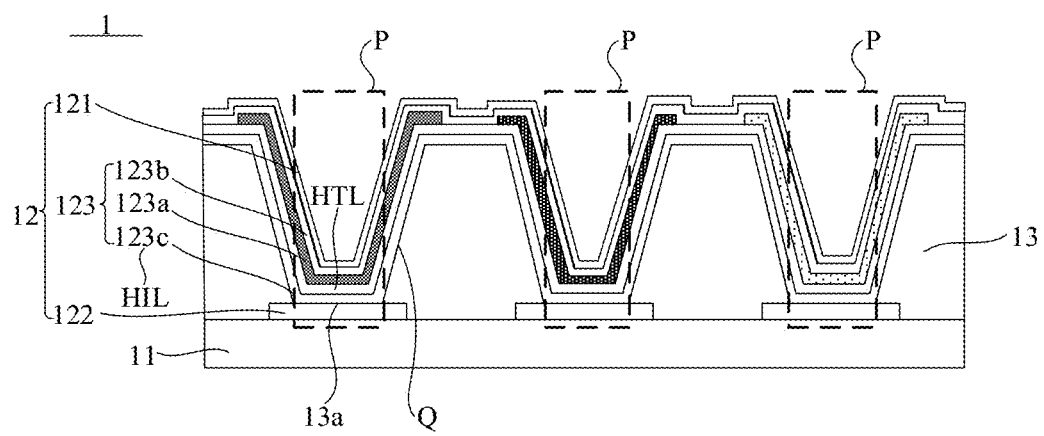
FIG. 1C is a sectional view showing a structure of another light-emitting substrate, in accordance with some embodiments.
Figure 1D:
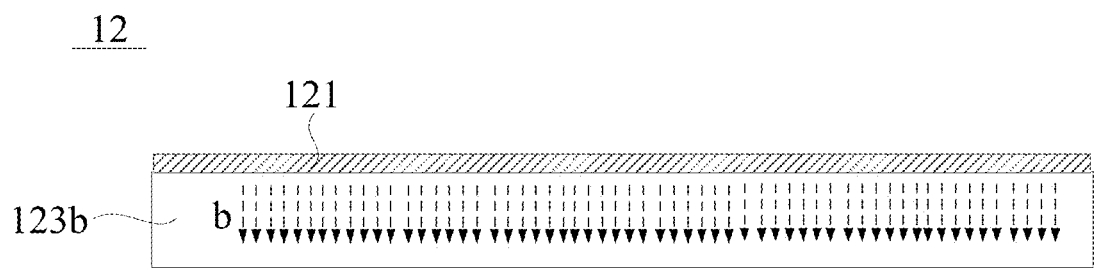
FIG. 1D is a diagram showing carriers in the light-emitting device shown in FIG. 1C transporting in a first semiconductor layer.
Figure 1E:
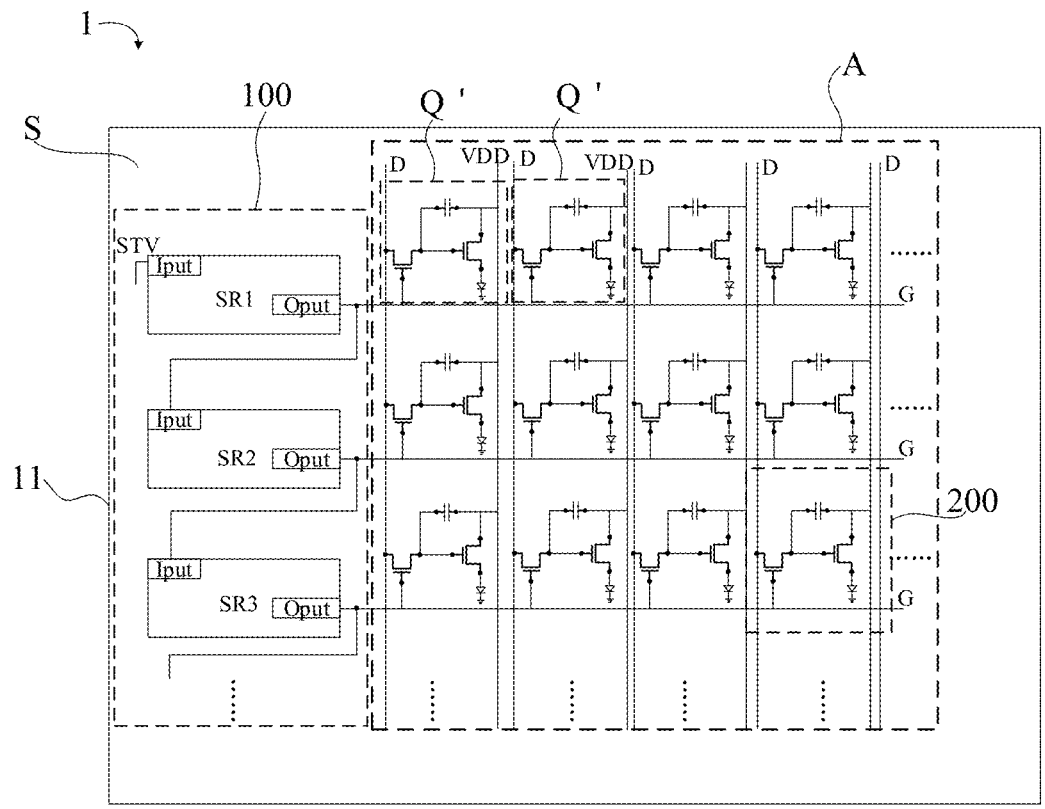
FIG. 1E is a top view showing a structure of a light-emitting substrate, in accordance with some embodiments.

In some embodiments, as shown in FIG. 1E, the light-emitting substrate 1 has a display region A, and a peripheral region S disposed on a periphery of the display region A. The display region A includes a plurality of sub-pixel regions Q', and each sub-pixel region Q' is provided with a pixel driving circuit 200 therein. The peripheral region S is used for wiring. For example, the peripheral region S is used for arranging a gate driving circuit 100 connected to the pixel driving circuits 200.

The pixel driving circuit 200 may include thin film transistors and capacitor(s). The pixel driving circuit 200 is configured to drive the light-emitting device 12 located in the corresponding sub-pixel region Q' to emit light. As shown in FIG. 1E, the pixel driving circuit 200 may be of a 2T1C (two transistors and a capacitor) structure.

Figure 1F:
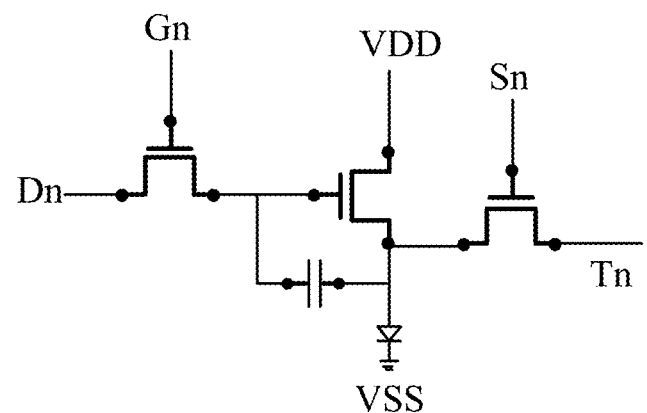
FIG. 1F is an equivalent circuit diagram of a 3T1C structure, in accordance with some embodiments.

Of course, the pixel driving circuit 200 may be of a 3T1C structure shown in FIG. 1F in addition to the 2T1C structure.

In some embodiments, as shown in FIGS. 1A to 1E, the light-emitting substrate 1 may further include a pixel defining layer 13. The pixel defining layer 13 defines a plurality of openings Q, and each opening Q corresponds to a region where a sub-pixel P is located (i.e., a sub-pixel region Q'). A plurality of light-emitting devices 12 may be arranged in one-to-one correspondence with the plurality of openings Q. Here, the plurality of light-emitting devices 12 may be all or part of light-emitting devices 12 included in the light-emitting substrate 1, and the plurality of openings Q may be all or part of openings Q in the pixel defining layer 13.

Regardless of the first semiconductor layer 123b being the electron transport layer, the electron injection layer, the hole transport layer or the hole injection layer, in a case where the light-emitting substrate 1 further includes the pixel defining layer 13, according to whether the first electrodes 121 are closer to or further away from the substrate 11 than second electrodes 122 are, the light-emitting substrate 1 may have two possible cases. In a first case, as shown in FIG. 1A, the first electrodes 121 are closer to the substrate 11 than the second electrodes 122 are. In this case, the first electrodes 121 are disposed at a side of the pixel defining layer 13 proximate to the substrate 11, and an opening Q exposes a first electrode 121. In this case, a portion of the first electrode 121 exposed by the opening Q is in contact with the first semiconductor layer 123b. In a second case, as shown in FIG. 1C, the first electrodes 121 are further away from the substrate 11 than the second electrodes 122 are. In this case, the first electrodes 121 are disposed at a side of the pixel defining layer 13 away from the substrate 11, and the first electrodes 121 are formed as a whole layer. In this case, the first semiconductor layer 123b may be a whole layer, and entireties of all the first electrodes 121 are in contact with the first semiconductor layer 123b.

Based on the above structures, by selecting materials of the hole injection layer, the hole transport layer, the electron injection layer, the electron transport layer, the electron blocking layer and the hole blocking layer, mobilities of electrons and holes, carrier concentration, a matching relationship of conductivities of materials of layers, and a matching relationship of energy levels of the materials of the layers may be adjusted. As a result, injection rates of electrons and holes may be adjusted to a certain extent, and therefore, a balance between electron injection and hole injection may be achieved to a certain extent. However, until now, in a case of selecting suitable material for each layer, electrons injected into the light-emitting layer 123a are still excessive. That is, the transport rate of electrons is greater than the transport rate of holes. Therefore, it is difficult to achieve the balance between the electron injection and the hole injection only by selecting materials and adjusting properties of the material, while imbalance between the electron injection and the hole injection is a crucial factor that affects the luminous efficiency and life of the light-emitting device.

In sight of this, in some embodiments, as shown in FIGS. 2A to 2D, in the light-emitting device 12, a portion of the first electrode 121 in contact with the first semiconductor layer 123b is provided with a hollow K therein, and the hollow K is located in a region where a sub-pixel P to which the light-emitting device 12 belongs is located, so that carriers injected into the light-emitting layer 123a by the first electrode 121 are reduced. The light-emitting device 12 is a light-emitting device 12 included in any sub-pixel P of the plurality of sub-pixels P.

Figure 2A:
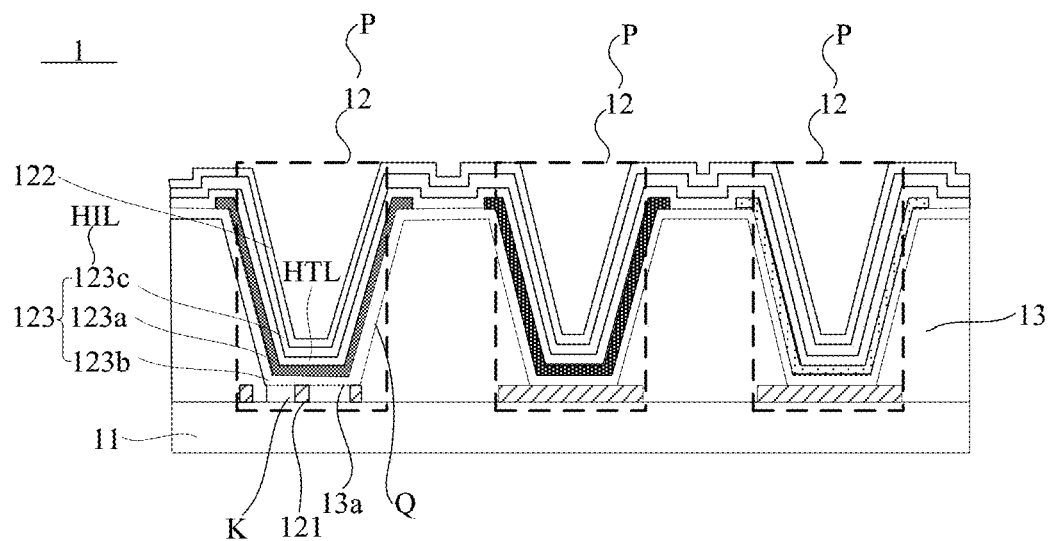
FIG. 2A is a sectional view showing a structure of a light-emitting substrate, in accordance with some embodiments.
Figure 2B:
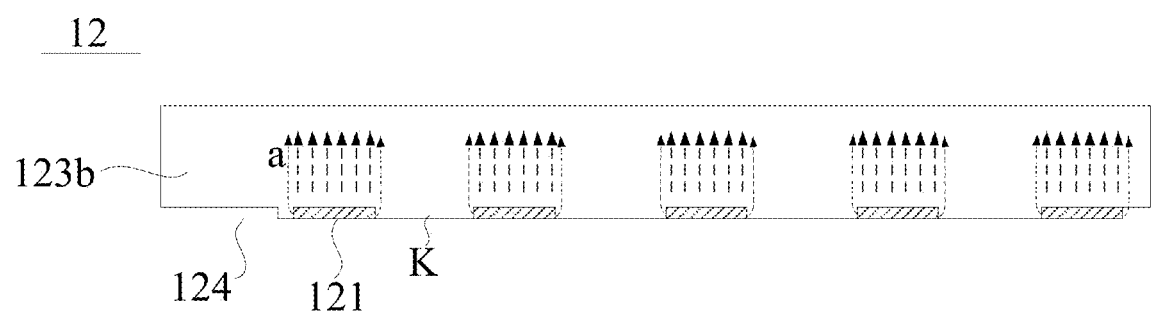
FIG. 2B is a diagram showing carriers in the light-emitting device shown in FIG. 2A transporting in a first semiconductor layer.
Figure 2C:
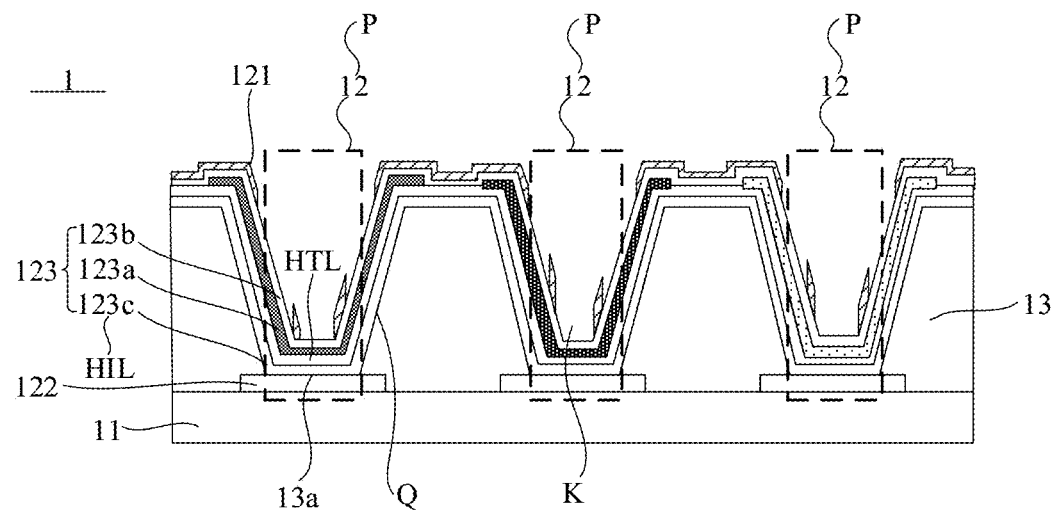
FIG. 2C is a sectional view showing a structure of another light-emitting substrate, in accordance with some embodiments.

As shown in FIG. 2A, the light-emitting device 12 may be one of the plurality of light-emitting devices 12. Alternatively, the light-emitting device 12 may be each of the plurality of light-emitting devices 12 (as shown in FIG. 2C). The hollow K means that portion(s) of the first electrode 121 are hollowed out.

There are two possible cases according to whether the first electrodes 121 are closer to or further away from the substrate 11 than the second electrodes 122 are. In the first case, as shown in FIGS. 1A, 1B, 2A and 2B, the first electrodes 121 are closer to the substrate 11 than the second electrodes 122 are. In this case, a portion of the first electrode 121 exposed by an opening Q is in contact with the first semiconductor layer 123b. As shown in FIGS. 1A and 1B, in a case of no hollow provided in the first electrode 121, an area of the portion of the first electrode 121 in contact with the first semiconductor layer 123b is equal to an area of a bottom 13a of the opening Q corresponding to the light-emitting device 12. In this case, when the first electrode 121 is energized, the whole portion of the first electrode 121 in contact with the first semiconductor layer 123b (i.e., a whole portion of the first electrode 121 located in the opening Q) provides a conductive path for carriers injection into the light-emitting layer 123a. Furthermore, the larger the area of the portion of the first electrode 121 in contact with the first semiconductor layer 123b (i.e., an area of the bottom 13a of the opening Q), the larger a cross-sectional area (i.e., an area of a surface perpendicular to a direction of the carrier transport (i.e., the direction shown by the arrow a in FIG. 1B)) of the conductive path provided for the carriers injection into the light-emitting layer 123a, and the more conducive to the carriers (e.g., the holes or the electrons) injection into the light-emitting layer 123a. In the embodiments of the present disclosure, as shown in FIGS. 2A and 2B, the hollow K is provided in the portion of the first electrode 121 in contact with the first semiconductor layer 123b. As a result, the cross-sectional area (i.e., an area of a surface perpendicular to a direction of the carrier transport (i.e., the direction shown by the arrow a in FIG. 2B)) of a conductive path actually provided by the portion of the first electrode 121 in contact with the first semiconductor layer 123b may be reduced. As a result, the carriers (the holes or the electrons) injection into the light-emitting layer 123a may be reduced, and therefore, the injection of the carriers may be adjusted. For example, considering an example in which the carriers are electrons, by reducing the electrons injection into the light-emitting layer 123a, the balance between the electron injection and the hole injection may be adjusted, thereby achieving the balance between the electron injection and the hole injection.

Figure 2D:
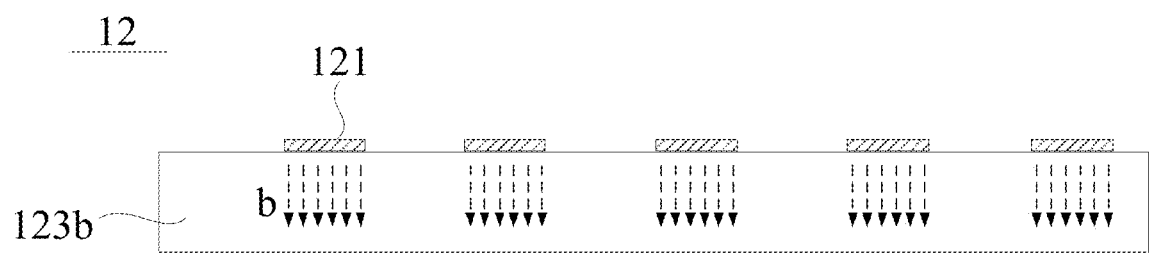
FIG. 2D is a diagram showing carriers in the light-emitting device shown in FIG. 2C transporting in a first semiconductor layer.

In the second case, as shown in FIGS. 1C, 1D, 2C and 2D, the second electrodes 122 are closer to the substrate 11 than the first electrodes 121 are. In this case, the first electrode 121 may be a whole layer, and the first semiconductor layer 123b may also be a whole layer. The whole first electrode 121 may be in contact with the first semiconductor layer 123b. As shown in FIGS. 1C and 1D, in a case of no hollow provided in the first electrode 121, a portion of the first electrode 121 located in a region where the sub-pixel P to which the light-emitting device 12 belongs is located is opposite to the bottom 13a of the opening Q, and an area of the portion of the first electrode 121 located in the region where the sub-pixel P to which the light-emitting device 12 belongs is located is equal to the area of the bottom 13a of the opening Q. In this case, when the first electrode 121 is energized, the portion of the first electrode 121 located in the region where the sub-pixel P to which the light-emitting device 12 belongs is located provides a conductive path for carriers injection into the light-emitting layer 123a. Furthermore, the larger the area of the portion of the first electrode 121 located in the region where the sub-pixel P to which the light-emitting device 12 belongs is located, the larger a cross-sectional area (i.e., an area of a surface perpendicular to a direction of the carrier transport (i.e., the direction shown by the arrow b in FIG. 1D)) of the conductive path provided for the carriers injection into the light-emitting layer 123a, and the more conducive to the carriers injection into the light-emitting layer 123a. In the embodiments of the present disclosure, as shown in FIGS. 2C and 2D, the hollow K is provided in the portion of the first electrode 121 in contact with the first semiconductor layer 123b. Since the hollow K is located in the region where the sub-pixel P to which the light-emitting device 12 belongs is located, the cross-sectional area (i.e., an area of a surface perpendicular to a direction of the carrier transport (i.e., the direction shown by the arrow b in FIG. 2D)) of a conductive path actually provided by the first electrode 121 may also be reduced. As a result, the carriers injection into the light-emitting layer 123a may be reduced, and therefore, the injection of the carriers may be adjusted. Here, still considering an example in which the carriers are electrons, by reducing the electrons injection into the light-emitting layer 123a, the balance between the electron injection and the hole injection may also be adjusted, thereby achieving the balance between the electron injection and the hole injection.

Here, it will be noted that, as shown in FIG. 1C, since the pixel defining layer 13 defines the plurality of openings Q, and each light-emitting device 12 is disposed in an opening Q, in a case where first electrode 121 of the light-emitting device 12 is the whole layer, in order to provide the hollow K in the portion of the first electrode 121 located in the region where the sub-pixel P to which the light-emitting device 12 belongs is located, as shown in FIG. 2C, the portion of the first electrode 121 located in the opening Q may be partially hollowed out, so that the hollow K may be provided in the portion of the first electrode 121 located in the opening Q. As a result, the area of the portion of the first electrode 121 located in the opening Q may be reduced, and the carriers injection into the light-emitting layer 123a of the light-emitting device 12 may be thus reduced.

In some embodiments, as shown in FIGS. 2A and 2C, an area of a first electrode 121 included in the light-emitting device 12 is smaller than an area of a light-emitting layer 123a included in the light-emitting device 12.

A region defined by the opening Q is an active light-emitting region, and the area of the light-emitting layer 123a may be greater than or equal to the area of the active light-emitting region. However, in these embodiments, since the area of the first electrode 121 included in the light-emitting device 12 is smaller than the area of the light-emitting layer 123a included in the light-emitting device 12, the area of the first electrode 121 included in the light-emitting device 12 may be smaller than the area of the active light-emitting region.

In some embodiments, as shown in FIGS. 2A and 2B, in a case where the first electrodes 121 are closer to the substrate 11 than the second electrodes 122 are, the hollow K is filled with a semiconductor material, and the semiconductor material is the same as a material of the first semiconductor layer 123b.

In these embodiments, in the case where the first electrodes 121 are closer to the substrate 11 than the second electrodes 122 are, after the first electrodes 121 are formed, the pixel defining layer 13 is formed to produce the openings Q, and a portion of the first electrode 121 is exposed. Since the portion of the first electrode 121 in contact with the first semiconductor layer is provided with the hollow K therein, the portion of the first electrode 121 exposed by the opening Q is provided with the hollow K therein. Then, the first semiconductor layer 123b is formed, and a portion of the first semiconductor layer 123b fills in the hollow K of the first electrode 121. In this way, when the first electrode 121 is energized, a side surface of the first electrode 121 may also drive the carriers injection into the first semiconductor layer 123b. In this case, the cross-sectional area of the conductive path actually provided by the first electrode 121 may be slightly larger than an area of an orthographic projection of the first electrode 121 on the substrate 11.

In some embodiments, the first electrode 121 is in ohmic contact with the first semiconductor layer 123b.

Fermi levels of any two solids in contact with each other must be equal in a strict sense, and a difference between a Fermi level and a vacuum level is referred to as a work function. When two materials come into contact with each other, electrons may flow from one side of a low work function to another side until the Fermi levels are in equilibrium, so that the material with the low work function will carry slight positive charges and the material with a high work function may become slightly electronegative, and an electrostatic field finally obtained is referred to as a built-in field (which may also be referred to as a space charge region or a depletion region). Due to the presence of the built-in field, an energy band at the interface between the two materials bends to form a Schottky barrier, and the presence of the barrier results in a large interfacial resistance. Contrary to a Schottky contact is an ohmic contact, and a contact barrier at the interface of the ohmic contact is very small or there is no contact barrier. That is, in a case where an ohmic contact is formed between the first electrode 121 and the first semiconductor layer 123b, the contact position between the first electrode 121 and the first semiconductor layer 123b has no space charge region but is a pure resistance, the resistance is very small and the voltage drop is small and negligible, so that the carriers may be transported.

In order to get a good ohmic contact, there are two prerequisites: first, a low barrier height between the first electrode 121 and the first semiconductor layer 123b; second, the first semiconductor layer 123b doped impurities with a high concentration.

The first prerequisite may increase the thermally excited part in the interfacial current, the second prerequisite may cause the depletion region of the first semiconductor layer 123b to narrow, so that the carriers (e.g., the electrons and the holes) have more opportunities to directly penetrate, and furthermore, a value of the contact resistance (abbreviated as Rc) decreases.

The material of the first electrode 121 and the material of the first semiconductor layer 123b are not limited, and all materials that enable the first electrode 121 to be in ohmic contact with the first semiconductor layer 123b are within the protection scope of the present disclosure.

In some embodiments, the material of the first semiconductor layer 123b is a metal oxide semiconductor material. That is, in these embodiments, the material of the first semiconductor layer 123b is an inorganic semiconductor material.

In this case, the first electrode 121 may include, for example, a metal material or a non-metallic material.

Here, there are two possible cases according to whether the carriers are electrons or holes. In a first case, the carriers are the electrons, and the work function of the material of the first electrode 121 is smaller than the work function of the material of the first semiconductor layer 123b. In a second case, the carriers are the holes, and the work function of the material of the first electrode 121 is greater than the work function of the material of the first semiconductor layer 123b.

The work function is the minimum energy needed to move an electron from an inside of a solid to a point immediately outside the solid surface. A magnitude of the work function is usually about one-half of a magnitude of an ionization energy of a free metal atom. Similarly, for a semiconductor material, the work function of the semiconductor is defined as the difference between the energy of a resting electron in vacuum and the energy of the Fermi level of the semiconductor. The smaller the work function, the easier it is for the electrons to escape from the surface of the solid; and the greater the work function, the less likely the electrons to escape from the surface of the solid.

Based on the above, in the first case, the material of the first electrode 121 may be selected from at least one of silver and aluminum, and the material of the first semiconductor layer 123b may be selected from at least one of zinc oxide (ZnO), zinc magnesium oxide (ZnMgO), titanium dioxide ($TiO_2$), tin dioxide ($SnO_2$) and zinc tin oxide (ZnSnO). In the second case, the material of the first electrode 121 may be selected from at least one of indium tin oxide (ITO), indium zinc oxide (IZO), palladium and platinum, and the material of the first semiconductor layer 123b may be selected from at least one of nickel oxide (NiO), tungsten trioxide ($WO_3$) and molybdenum oxide ($MoO_x$) (e.g., X may be 3).

It will be noted that, the material of the first electrode 121 being selected from at least one of silver and aluminum means that, the first electrode 121 may be a silver electrode, an aluminum electrode or an alloy electrode of silver and aluminum. The material of the first semiconductor layer 123b being selected from ZnO, ZnMgO, $TiO_2$, $SnO_2$ and ZnSnO means that, the material of the first semiconductor layer 123b may be ZnO, ZnMgO, $TiO_2$, $SnO_2$ or ZnSnO, alternatively, the material of the first semiconductor layer 123b may be a mixture of more than one of ZnO, ZnMgO, $TiO_2$, $SnO_2$ and ZnSnO. The material of the first electrode 121 being selected from at least one of ITO, IZO, palladium and platinum means that, the first electrode 121 may be a transparent electrode (e.g., the material of the first electrode 121 is ITO or IZO, alternatively, the material of the first electrode 121 is a mixture of ITO and IZO) or a metal electrode (e.g., the material of the first electrode 121 is palladium or platinum, alternatively, the material of the first electrode 121 is a mixture of palladium and platinum), alternatively the first electrode 121 may be of a laminated structure of the transparent electrode and the metal electrode.

In addition, it will further be noted that, in order to get a good ohmic contact, the material of the first electrode 121 may be selected from metal materials. In this case, in order to improve light-emitting effect, optionally, the light emitted by the light-emitting device 12 exits from the second electrode 122. That is, the second electrode 122 may be a transparent electrode. In this case, there are two possible cases according to whether the first electrodes 121 are closer to or further away from the substrate 11 than the second electrodes 122 are. In a first case, the first electrodes 121 are closer to the substrate 11 than the second electrodes 122 are, and in this case, the light-emitting substrate 1 is a top-emission light-emitting substrate. In a second case, the first electrodes 121 are further away from the substrate 11 than the second electrodes 122 are, and in this case, the light-emitting substrate 1 is a bottom-emission light-emitting substrate.

Based on the above, there are two possible cases according to whether that carriers are the electrons or the holes. In a first case, the carriers are the electrons, and in this case, the second electrode 122 may be selected from high work function materials. For example, the second electrode may be a transparent oxide electrode, such as an ITO electrode, an IZO electrode, or an indium gallium zinc oxide (IGZO) electrode. In a second case, the carriers are the holes, and in this case, the second electrode 122 may be selected from low work function materials. For example, the second electrode 122 may be a metal electrode with a thin thickness.

Figure 2E:
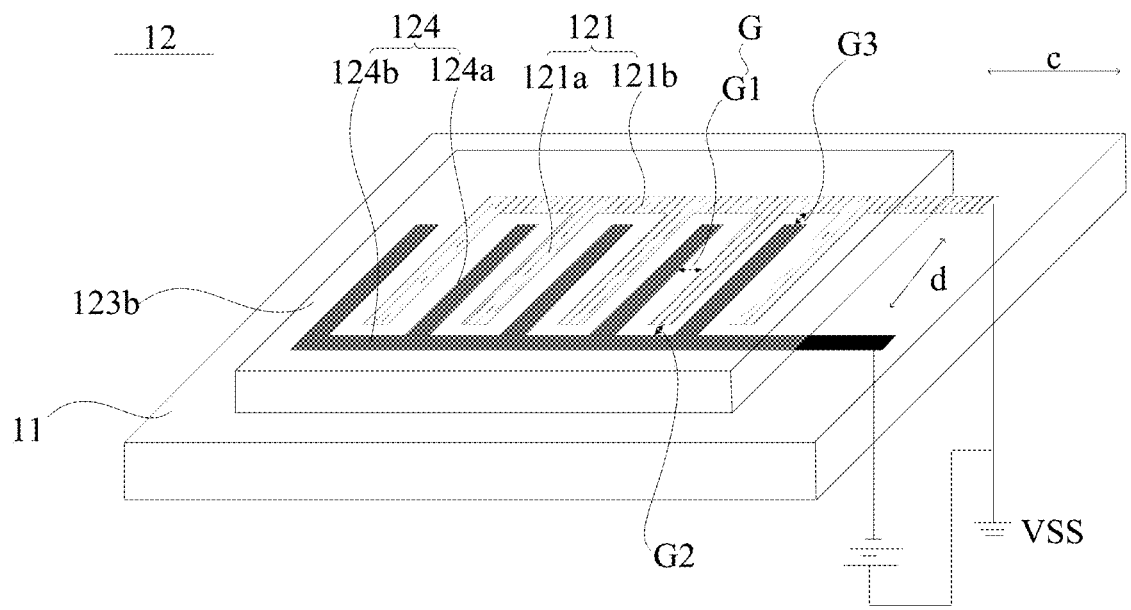
FIG. 2E is a diagram showing a structure of a first electrode and a third electrode of a light-emitting device, in accordance with some embodiments.
Figure 2F:
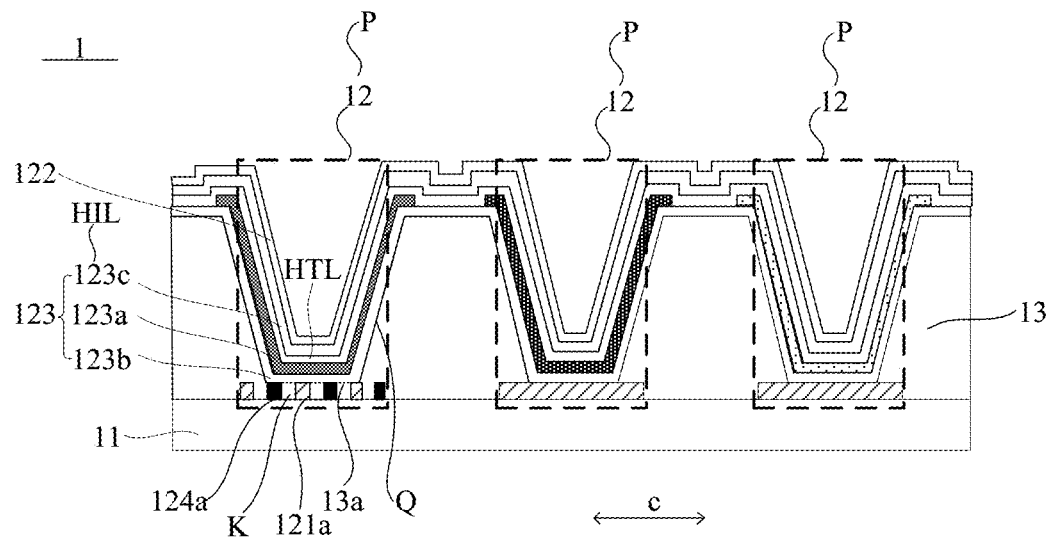
FIG. 2F is a sectional view showing a structure of another light-emitting substrate, in accordance with some embodiments.

In some embodiments, as shown in FIGS. 2E and 2F, the first electrode 121 included in the light-emitting device 12 includes a plurality of first tooth-shaped sub-electrodes 121a arranged at intervals sequentially in a first direction (as shown by the arrow c in FIGS. 2E and 2F). The first direction is parallel to a plane where the substrate 11 is located. The plurality of first tooth-shaped sub-electrodes 121a are configured to receive a first voltage. The hollow K is provided between any two adjacent first tooth-shaped sub-electrodes 121a.

The plurality of first tooth-shaped sub-electrodes 121a may receive the first voltage through a wire. An end of the wire may be connected to ends of the plurality of first tooth-shaped sub-electrodes 121a, and another end of the wire may be electrically connected to an electrical connection line or an electrode that can provide a corresponding or same voltage in a pixel driving circuit through a via hole.

In some embodiments, as shown in FIGS. 2E, the plurality of first tooth-shaped sub-electrodes 121a are each in a strip shape and extend in a second direction (as shown by the arrow d in FIG. 2E). The second direction is parallel to the plane where the substrate 11 is located and is perpendicular to the first direction. The first electrode 121 included in the light-emitting device 12 further includes a first shank-shaped sub-electrode 121b. The first shank-shaped sub-electrode 121b is disposed at a side of the plurality of first tooth-shaped sub-electrodes 121a in the second direction, and in contact with ends of the plurality of first tooth-shaped sub-electrodes 121a proximate to the first shank-shaped sub-electrode 121b. The first shank-shaped sub-electrode 121b is configured to receive the first voltage, so as to provide the plurality of first tooth-shaped sub-electrodes 121a with the first voltage.

In these embodiments, as shown in FIG. 2E, the first electrode 121 may be in a comb shape, and the first shank-shaped sub-electrode 121b may connect the plurality of first tooth-shaped sub-electrodes 121a together. By providing the first shank-shaped sub-electrode 121b with the first voltage, the plurality of first tooth-shaped sub-electrodes 121a may be provided with the first voltage.

The first shank-shaped sub-electrode 121b may be electrically connected to the electrical connection line or the electrode that can provide the corresponding or same voltage in the pixel driving circuit through a via hole.

FIG. 2E is a diagram showing a circuit that an end of first shank-shaped sub-electrode 121b is in contact with the plurality of first tooth-shaped sub-electrodes 121a, and another end of first shank-shaped sub-electrode 121b receives the first voltage.

Here, considering an example in which the carriers are the electrons, the first shank-shaped sub-electrode 121b may be electrically connected to a grounding wire VSS in the pixel driving circuit.

In some embodiments, the first shank-shaped sub-electrode 121b and the plurality of first tooth-shaped sub-electrodes 121a are made of a same material. In this way, the plurality of first tooth-shaped sub-electrodes 121a and the first shank-shaped sub-electrode 121b may be formed by a same patterning process.

Figure 2G:
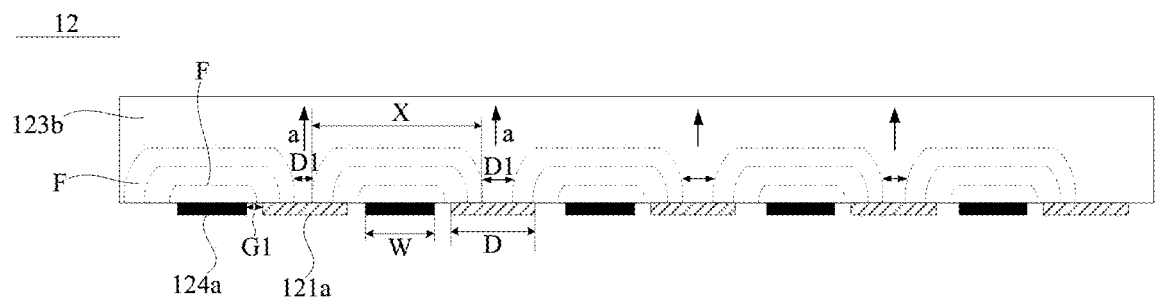
FIG. 2G is a principle diagram of adjusting an effective width of a first electrode when a third electrode is energized, in accordance with some embodiments.

In some embodiments, as shown in FIGS. 2E, 2F and 2G, the light-emitting substrate 1 further includes a third electrode 124 disposed in the hollow K. There is a gap G between the third electrode 124 and the first electrode 121, and the third electrode 124 is in Schottky contact with the first semiconductor layer 123b.

The Schottky contact is relative to the ohmic contact. As described above, in a case where the third electrode 124 is in Schottky contact with the first semiconductor layer 123b, an energy band at the interface between the third electrode 124 and the first semiconductor layer 123b bend to form a Schottky barrier, and there is a large interfacial resistance. In addition, the difference between the work function of the third electrode 124 and the work function of the first semiconductor layer 123b cause the third electrode 124 and the first semiconductor layer 123b to be regarded as a p-n junction. Majority carriers in both sides of the p-n junction are injected into and diffuse toward each other to form a space charge region F. The space charge region F is an electric dipole layer composed of positive and negative charges, in which there is a strong built-in electric field, i.e., the above-mentioned built-in field. The function of the built-in field is to block majority carriers on each side from further diffusion toward the other side. When the equilibrium is reached, the space charge region F of the p-n junction has a certain thickness. The more space charges, the stronger the built-in electric field, and the greater the thickness of the space charge region F; and conversely, the weaker the electric field in the space charge region F, the less charges therein, and the smaller the thickness of the space charge region F.

In these embodiments, the third electrode 124 is provided in the hollow K. Since the third electrode 124 is in Schottky contact with the first semiconductor layer 123b, the built-in field is generated at the interface where the third electrode 124 and the first semiconductor layer 123b are in contact. The presence of the built-in field results in the large interfacial resistance between the third electrode 124 and the first semiconductor layer 123b, which may block the driving, by the side surface of the first electrode 121, of the carriers of the first semiconductor layer 123b in a region where the third electrode 124 is located, so that the cross-sectional area of the conductive path of the carriers may be reduced to a certain extent. In addition, as the thickness of the space charge region F gets thicker, the space charge region F may extend along the plane where the first semiconductor layer 123b is located, and as the size of the space charge region F in the plane where the first semiconductor layer 123b is located becomes larger, the cross-sectional area of the conductive path of the carriers becomes smaller, which is more conducive to reduce carrier injection. As a result, the carrier injection may be adjusted.

Similar to the formation of the ohmic contact, the material of the third electrode 124 is not limited. In a case where the material of the first semiconductor layer 123b is determined, all materials that enable the third electrode 124 to be in Schottky contact with the first semiconductor layer 123b are within the protection scope of the present disclosure.

Here, there are two possible cases according to whether the carriers are electrons or holes. In a first case, the carriers are the electrons, and the work function of the material of the third electrode 124 is greater than the work function of the material of the first semiconductor layer 123b. In this case, the material of the third electrode 124 may be selected from at least one of ITO, IZO, gold, palladium, platinum and nickel. In a second case, the carriers are the holes, and the work function of the material of the third electrode 124 is smaller than the work function of the material of the first semiconductor layer 123b. In this case, the material of the third electrode 124 may be selected from at least one of silver and aluminum.

It will be noted that, the material of the third electrode 124 being selected from at least one of ITO, IZO, gold, palladium, platinum and nickel means that, the third electrode 124 may be a transparent electrode (e.g., the material of the third electrode 124 is ITO or IZO, alternatively, the material of the third electrode 124 is a mixture of ITO and IZO) or a metal electrode (e.g., the material of the third electrode 124 is gold, palladium, platinum or nickel, alternatively, the material of the third electrode 124 is a mixture of more than one of gold, palladium, platinum and nickel), alternatively, the third electrode 124 may be of a laminated structure of the transparent electrode and the metal electrode. The material of the third electrode 124 being selected from at least one of silver and aluminum means that, the third electrode 124 may be a silver electrode, an aluminum electrode or an alloy electrode of silver and aluminum.

In some embodiments, as shown in FIGS. 2E, 2F and 2G, the third electrode 124 is configured to receive a second voltage. The second voltage is configured to adjust an effective width D1 of the first electrode 121. The effective width D1 of the first electrode 121 is a width of a conductive path that the first electrode 121 is capable of providing for the carriers injection into the light-emitting layer 123a.

The first electrode 121 and the third electrode 124 may each be in any shape, which is not limited here.

In some examples, as shown in FIGS. 2E and 2G, in a case where the first electrode 121 includes the plurality of first tooth-shaped sub-electrodes 121a arranged at intervals sequentially in the first direction, and the third electrode 124 is in a strip shape and disposed between two adjacent first tooth-shaped sub-electrodes 121a, the space charge region F formed by the third electrode 124 and the first semiconductor layer 123b extends in the first direction and in a thickness direction of the first semiconductor layer 123b. In this case, the effective width D1 of the first electrode 121 means an effective width D1 of the first electrode 121 in the first direction, that is, the effective width D1 of the first electrode 121 is a width of a conductive path that the first electrode 121 is capable of providing in the first direction for the carriers injection into the light-emitting layer 123a.

Figure 2H:
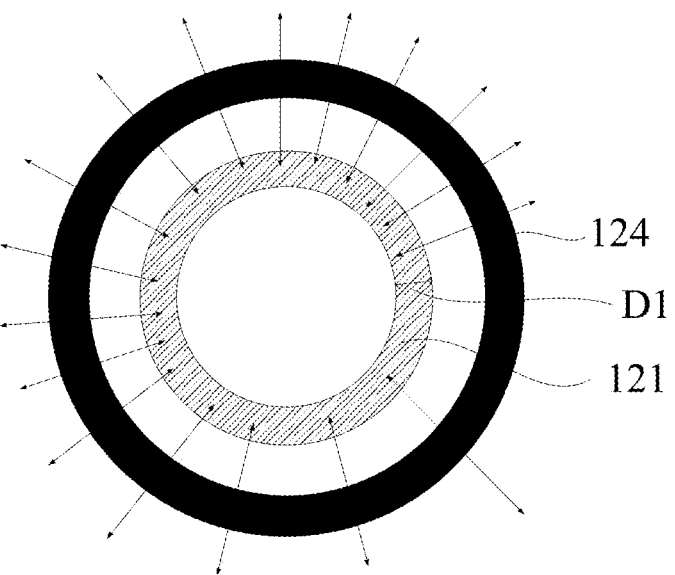
FIG. 2H is another principle diagram of adjusting an effective width of a first electrode when a third electrode is energized, in accordance with some embodiments.

In some other examples, as shown in FIG. 2H, in a case where the first electrode 121 and the third electrode 124 are each in an annular shape, the space charge region formed by the third electrode 124 and the first semiconductor layer extends in a radial direction of the annulus and in the thickness direction of the first semiconductor layer. In this case, the effective width of the first electrode 121 is an effective width of the first electrode 121 in the radial direction, that is, the effective width D1 of the first electrode 121 is a width of a conductive path that the first electrode 121 is capable of providing in the radial direction for the carriers injection into the light-emitting layer 123a.

In these embodiments, as shown in FIG. 2G, in a case where the material of the third electrode 124 and a width of the third electrode 124 in the first direction or in the radial direction (i.e., an actual width W of the third electrode 124) are determined, a thickness (i.e., a size in the thickness direction of the first semiconductor layer 123b) of the space charge region F formed by the third electrode 124 and the first semiconductor layer 123b and a width of the space charge region F in the first direction or in the radial direction of the annulus are determined. By providing the second voltage for the third electrode 124, the thickness of the space charge region F and the width X of the space charge region F in the first direction or in the radial direction of the annulus are adjusted, and thus the effective width D1 of the first electrode 121 in the first direction or in the radial direction of the annulus may be adjusted. Furthermore, by adjusting the effective width D1 of the first electrode 121 in the first direction or in the radial direction of the annulus, the width of the conductive path for the carriers in the first direction or in the radial direction of the annulus may be adjusted, so that the carrier injection may be adjusted.

Considering an example in which the carriers are the electrons, in a case where the third electrode 124 is in Schottky contact with the first semiconductor layer 123b, the work function of the material of the third electrode 124 is greater than the work function of the material of the first semiconductor layer 123b. In this case, majority carriers in the third electrode 124 are holes and majority carriers in the first semiconductor layer 123b are electrons, and the direction of a formed built-in electric field is from the first semiconductor layer 123b to the third electrode 124, that is, from the n-region of the p-n junction to the p-region of the p-n junction. When a forward voltage is applied to the p-n junction (i.e., a positive voltage is applied to the third electrode 124), the direction of the formed electric field is opposite to the direction of the built-in electric field, and therefore, the formed electric field and the built-in electric field cancel each other, so that the total electric field of the space charge region F decreases, and thus the positive and negative charges in the space charge region F are reduced. In this way, the thickness of the space charge region F and the width X of the space charge region F in the first direction or in the radial direction of the annulus are reduced. In contrary, when a reverse voltage is applied to the p-n junction (i.e., a negative voltage is applied to the third electrode 124), the direction of the formed electric field is consistent with the direction of the built-in electric field, and therefore, the formed electric field and the built-in electric field reinforce each other, so that the total electric field of the space charge region F increases, and thus the thickness of the space charge region F and the width X of the space charge region F in the first direction or in the radial direction of the annulus increase.

Figure 2I:
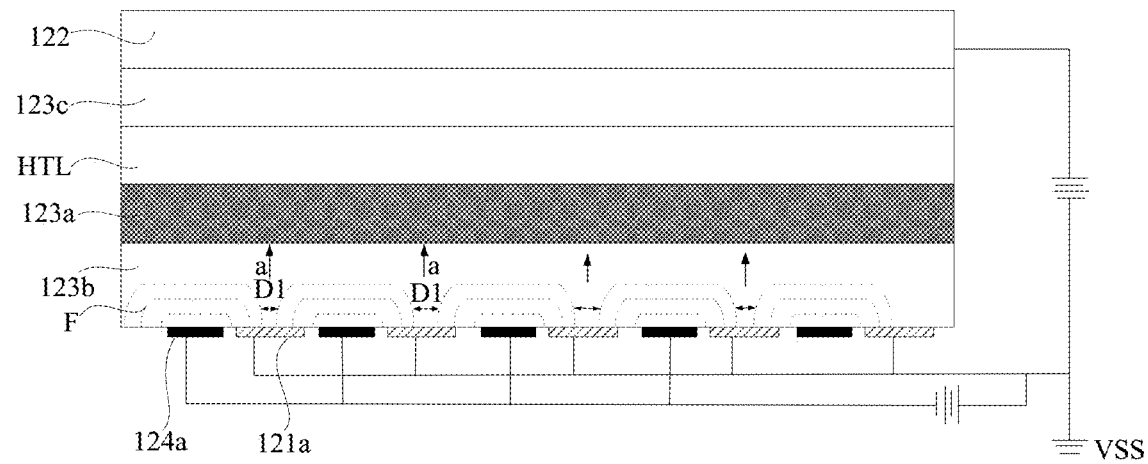
FIG. 2I is a circuit connection diagram of a first electrode, a second electrode and a third electrode of a light-emitting device, in accordance with some embodiments.

That is, in the above embodiments, in a case where the carriers are the electrons, in order to make the effective width D1 of the first electrode 121 smaller than the actual width D of the first electrode 121, the negative voltage may be applied to the third electrode 124, i.e., the second voltage may be the negative voltage. FIG. 2I shows a circuit connection diagram of the first electrode 121, the second electrode 122 and the third electrode 124 in a case where the carriers are the electrons.

The third electrode 124 may receive the second voltage through a wire. An end of the wire may be electrically connected to the third electrode 124, and another end of the wire may be electrically connected to an electrical connection line or an electrode that can provide a corresponding or same voltage in the pixel driving circuit through a via hole.

Of course, in a case where the pixel driving circuit includes no electrical connection line or no electrode that can provide the corresponding or same voltage, the electrical connection line or the electrode that can provide the corresponding or same voltage may be added in the pixel driving circuit, and the second voltage is provided for the third electrode 124 through the driver IC.

It will further be noted that, the second voltage may be a constant voltage or a variable voltage. In a case where the second voltage is the constant voltage, the thickness of the space charge region F and the width of the space charge region F in the first direction or in the radial direction of the annulus are determined, and the effective width of the first electrode 121 in the first direction or in the radial direction of the annulus may only be adjusted to a constant width. In a case where the second voltage is the variable voltage, the thickness of the space charge region F and the width of the space charge region F in the first direction or in the radial direction of the annulus are variable, and in this case, the effective width of the first electrode 121 in the first direction or in the radial direction of the annulus may be adjusted to a constant direction according to actual situations.

Only examples in which the carriers are the electrons are described here, and it will be understood by those skilled in the art that, in a case where the carriers are the holes, in order to make the effective width D1 of the first electrode 121 smaller than the actual width D of the first electrode 121, the positive voltage may be applied to the third electrode 124, i.e., the second voltage may be the positive voltage. Furthermore, in a case where the positive voltage is applied to the first electrode 121, the second voltage is greater than the voltage applied to the first electrode 121.

In some embodiments, as shown in FIGS. 2E and 2G, in a case where the first electrode 121 included in the light-emitting device 12 includes the plurality of first tooth-shaped sub-electrodes 121a arranged at intervals sequentially in the first direction, the third electrode 124 includes a plurality of second tooth-shaped sub-electrodes 124a arranged at intervals sequentially in the first direction. Each second tooth-shaped sub-electrode 124a is located between two adjacent first tooth-shaped sub-electrodes 121a, or each first tooth-shaped sub-electrode 121a is located between two adjacent second tooth-shaped sub-electrodes 124a. Furthermore, there is a first gap G1 between each second tooth-shaped sub-electrode 124a and any first tooth-shaped sub-electrode 121a adjacent to the second tooth-shaped sub-electrode 124a, and the first gap G1 belongs to the above gap G.

In these embodiments, since the plurality of first tooth-shaped sub-electrodes 121a and the plurality of second tooth-shaped sub-electrodes 124a are all arranged in the first direction, when the plurality of first tooth-shaped sub-electrodes 121a and the plurality of second tooth-shaped sub-electrodes 124a are energized, space charge regions F formed by the plurality of second tooth-shaped sub-electrodes 124a in the first semiconductor layer 123b extend in the first direction and in the thickness direction of the first semiconductor layer 123b, and a space charge region F formed by a second tooth-shaped sub-electrode 124a may extend in the first direction to a region where a first tooth-shaped sub-electrode 121a adjacent to the second tooth-shaped sub-electrode 124a is located, so that the effective width D1 of the first tooth-shaped sub-electrode 121a in the first direction may be adjusted.

One or more first tooth-shaped sub-electrodes 121a may be provided between every two adjacent second tooth-shaped sub-electrodes 124a, and one or more second tooth-shaped sub-electrodes 124a may be provided between every two adjacent first tooth-shaped sub-electrodes 121a, which are not limited here.

In order to adjust the effective width D1 of each first tooth-shaped sub-electrode 121a in the first direction on both sides of the first tooth-shaped sub-electrode 121a in the first direction, optionally, as shown in FIG. 2E, a first tooth-shaped sub-electrode 121a is provided between every two adjacent second tooth-shaped sub-electrodes 124a.

In this case, when the third electrode 124 is energized, space charge regions F formed by two adjacent second tooth-shaped sub-electrodes 124a and the first semiconductor layer 123b both extend in the first direction. As the two space charge regions F extend to a region where a first tooth-shaped sub-electrode 121a between the two second tooth-shaped sub-electrodes 124a is located, the width of the conductive path of the first tooth-shaped sub-electrode 121a in the first direction may be adjusted. As shown in FIG. 2G, the larger the widths X of the two space charge regions F in the first direction, the narrower the conductive path of the first tooth-shaped sub-electrode 121a. As a result, the injection rate of the carriers in the conductive path may be reduced, and thus injection balance of the carriers may be adjusted.

In some embodiments, as shown in FIG. 2G, a width of the first tooth-shaped sub-electrode 121a in the first direction (i.e., an actual width D1) and a width of the second tooth-shaped sub-electrode 124a in the first direction (i.e., an actual width W) are both smaller than 100 µm, and the first gap G1 is smaller than 10 µm.

In these embodiments, by limiting the width of the first tooth-shaped sub-electrode 121a in the first direction and the width of the second tooth-shaped sub-electrode 124a in the first direction within the above ranges respectively, dense inter-digitated electrodes may be formed, so that the number of conductive paths that are regulated is large enough. In addition, by limiting the first gap G1 within the above range, a width of a conductive path in the first direction may be well regulated, so as to achieve an effective width control of the conductive path.

The width of the first tooth-shaped sub-electrode 121a in the first direction (i.e., the actual width D1) and the width of the second tooth-shaped sub-electrode 124a in the first direction (i.e., the actual width W) may be the same or different.

In order to use a single mask for manufacturing and save manufacturing cost, in some embodiments, the width of the first tooth-shaped sub-electrode 121a in the first direction (i.e., the actual width D1) and the width of the second tooth-shaped sub-electrode 124a in the first direction (i.e., the actual width W) are the same.

It will further be noted that, in actual manufacturing process, in order to avoid the contact between the first tooth-shaped sub-electrode 121a and the second tooth-shaped sub-electrode 124a, optionally, the first gap G1 may be set to be greater than or equal to 1 µm.

The structure of the plurality of second tooth-shaped sub-electrodes 124a is not limited, and the plurality of second tooth-shaped sub-electrodes 124a may each be in any shape.

In some embodiments, as shown in FIG. 2E, the plurality of second tooth-shaped sub-electrodes 124a are each in a strip shape and extend in the second direction.

In these embodiments, the shapes of the plurality of second tooth-shaped sub-electrodes 124a may be the same as the shapes of the plurality of first tooth-shaped sub-electrodes 121a, that is, the second tooth-shaped sub-electrodes 124a are parallel to the first tooth-shaped sub-electrodes 121a.

In some embodiments, as shown in FIG. 2E, the third electrode 124 further includes a second shank-shaped sub-electrode 124b. The second shank-shaped sub-electrode 124b is disposed at a side of the plurality of second tooth-shaped sub-electrodes 124a in the second direction and in contact with ends of the plurality of second tooth-shaped sub-electrodes 124a proximate to the second shank-shaped sub-electrode 124b. The second shank-shaped sub-electrode 124b is configured to receive the second voltage, so as to provide the third electrode 124 with the second voltage.

In these embodiments, the third electrode 124 may be in a comb shape, and the second shank-shaped sub-electrode 124b connects the plurality of second tooth-shaped sub-electrodes 124a together. By providing the second shank-shaped sub-electrode 124b with the second voltage, the plurality of second tooth-shaped sub-electrodes 124a may be provided with the second voltage.

The second shank-shaped sub-electrode 124b may be electrically connected to the electrical connection line or the electrode that can provide the corresponding or same voltage in the pixel driving circuit through a via hole.

FIG. 2E shows a situation where an end of the second shank-shaped sub-electrode 124b is in contact with the plurality of second tooth-shaped sub-electrodes 124a, and another end of the second shank-shaped sub-electrode 124b receives the second voltage.

Here, considering an example in which the carriers are the electrons, the second shank-shaped sub-electrode 124b may be electrically connected to an electrical connection line or an electrode that provides a negative voltage in the pixel driving circuit.

In some embodiments, the second shank-shaped sub-electrode 124b and the plurality of second tooth-shaped sub-electrodes 124a are made of a same material. In this way, the second shank-shaped sub-electrode 124b and the plurality of second tooth-shaped sub-electrodes 124a may be formed by a same patterning process.

Of course, in order to reduce the voltage drop, the material of the second shank-shaped sub-electrode 124b may be different from the material of the plurality of second tooth-shaped sub-electrodes 124a, that is, the material of the second shank-shaped sub-electrode 124b may be a material that can make the second shank-shaped sub-electrode 124b inohmic contact with the first semiconductor layer 123b.

In some embodiments, as shown in FIG. 2E, in a case where the first electrode 121 further includes the first shank-shaped sub-electrode 121b, the second shank-shaped sub-electrode 124b and the first shank-shaped sub-electrode 121b are respectively located at two opposite sides of both the plurality of first tooth-shaped sub-electrodes 121a and the plurality of second tooth-shaped sub-electrodes 124a in the second direction. The second shank-shaped sub-electrode 124b is in contact with the ends of the plurality of second tooth-shaped sub-electrodes 124a proximate to the second shank-shaped sub-electrode 124b, and a second gap G2 exists between the second shank-shaped sub-electrode 124b and ends of the plurality of first tooth-shaped sub-electrodes 121a away from the first shank-shaped sub-electrode 121b. The first shank-shaped sub-electrode 121b is in contact with ends of the plurality of first tooth-shaped sub-electrodes 121a proximate to the first shank-shaped sub-electrode 121b, and a third gap G3 exists between the first shank-shaped sub-electrode 121b and ends of the plurality of second tooth-shaped sub-electrodes 124a away from the second shank-shaped sub-electrode 124b.

In these embodiments, the second shank-shaped sub-electrode 124b and the first shank-shaped sub-electrode 121b are respectively located at the two opposite sides of both the plurality of first tooth-shaped sub-electrodes 121a and the plurality of second tooth-shaped sub-electrodes 124a in the second direction. Therefore, the first electrode 121 and the third electrode 124 are both in comb shapes, and the first tooth-shaped sub-electrodes 121a and the second tooth-shaped sub-electrodes 124a are inter-digitated. The plurality of first tooth-shaped sub-electrodes 121a may be provided with the first voltage through the first shank-shaped sub-electrode 121b, and the plurality of second tooth-shaped sub-electrodes 124a may be provided with the second voltage through the second shank-shaped sub-electrode 124b, so that it is achieved that the space charge region F formed by the second tooth-shaped sub-electrode 124a and the first semiconductor layer 123b adjusts the effective width of the first tooth-shaped sub-electrode 121a in the first direction, and thus the carrier injection may be adjusted.

The second gap G2 exists between the second shank-shaped sub-electrode 124b and the ends of the plurality of first tooth-shaped sub-electrodes 121a away from the first shank-shaped sub-electrode 121b, the third gap G3 exists between the first shank-shaped sub-electrode 121b and the ends of the plurality of second tooth-shaped sub-electrodes 124a away from the second shank-shaped sub-electrode 124b, the second shank-shaped sub-electrode 124b may be in ohmic contact or Schottky contact with the first semiconductor layer 123b, and the first shank-shaped sub-electrode 121b may be in ohmic contact with the first semiconductor layer 123b. Therefore, in a case where the second shank-shaped sub-electrode 124b is in Schottky contact with the first semiconductor layer 123b, if the second gap G2 is small enough (e.g., the second gap G2 may be a gap that only keeps the second shank-shaped sub-electrode 124b and the first tooth-shaped sub-electrodes 121a out of contact with each other), alternatively, if the size of the second shank-shaped sub-electrode 124b in the second direction is equal to the width of the first tooth-shaped sub-electrode 121a in the first direction and the second gap G2 is smaller than or equal to the first gap G1, the space charge region F formed by the second shank-shaped sub-electrode 124b and the first semi-conductor layer 123b may extend to a region where the first tooth-shaped sub-electrodes 121a are located, so that an effective length of the first tooth-shaped sub-electrode 121a (a length of a conductive path formed in the second direction) may be adjusted, which may further adjust the cross-sectional area of the conductive path. Furthermore, the ohmic contact between the first shank-shaped sub-electrode 121b and the first semiconductor layer 123b may not adjust the effective length of the first tooth-shaped sub-electrodes 121a. Therefore, the third gap G3 may be satisfied as long as it is sufficient to allow the first shank-shaped sub-electrode 121b and the second tooth-shaped sub-electrodes 124a not to be in contact with each other.

In some embodiments, the second gap G2 is larger than or equal to 1 μm and smaller than or equal to 10 μm, and the third gap G3 is larger than or equal to 1 μm and smaller than or equal to 10 μm.

In these embodiments, the second gap G2 and the third gap G3 may be the same or different. By limiting the second gap G2 and the third gap G3 within the above ranges respectively, it may be avoided that the second gap G2 and the third gap G3 are too small that the first tooth-shaped sub-electrodes 121a are easily in contact with the second shank-shaped sub-electrode 124b and the first shank-shaped sub-electrode 121b is easily in contact with the second tooth-shaped sub-electrodes 124b during manufacturing, and it may also be avoided that the second gap G2 and the third gap G3 are too large, which is not conducive to making full use of the space to form the conductive paths.

Figure 2J:
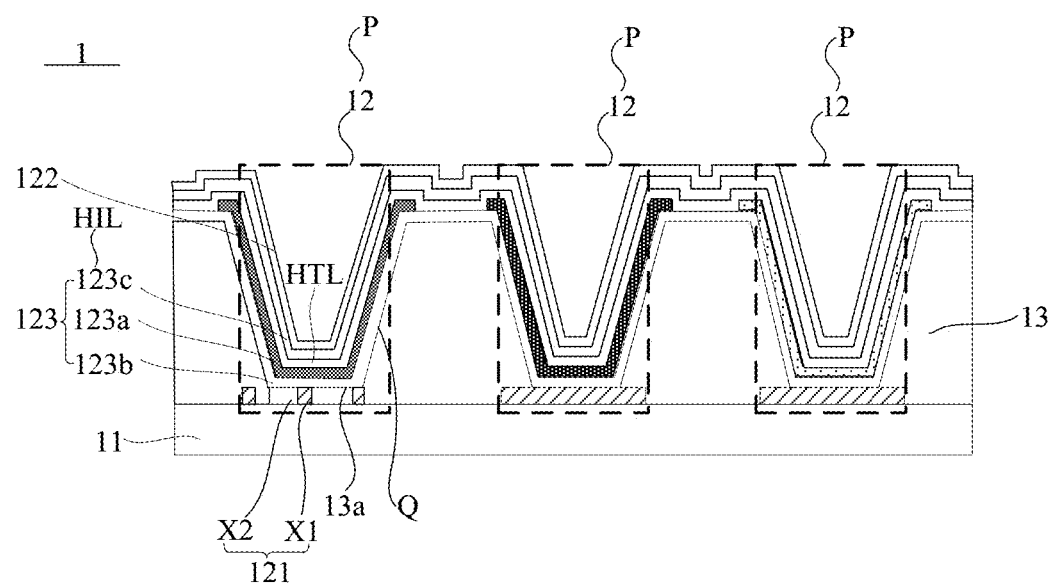
FIG. 2J is a sectional view showing a structure of another light-emitting substrate, in accordance with some embodiments.

Some embodiments of the present disclosure provide a light-emitting substrate. As shown in FIG. 2J, the light-emitting substrate 1 includes a substrate 11, and a plurality of sub-pixels P disposed on the substrate 11. Each sub-pixel P includes a light-emitting device 12 disposed on the substrate 11. Each light-emitting device 12 includes a first electrode 121, a second electrode 122, and a light-emitting functional layer 123 disposed between the first electrode 121 and the second electrode 122.

The light-emitting functional layer 123 may include a light-emitting layer 123a and a first semiconductor layer 123b located between the light-emitting layer 123a and the first electrode 121. The first semiconductor layer 123b may be any one of an electron transport layer (ETL), a hole transport layer (HTL), an electron injection layer (EIL) and a hole injection layer (HIL).

Of course, in some other embodiments, in a case where the first semiconductor layer 123b is the electron injection layer (EIL), the electron transport layer (ETL) and/or a hole blocking layer may be provided between the first semiconductor layer 123b and the light-emitting layer 123a; and in a case where the first semiconductor layer 123b is the hole injection layer (HIL), the hole transport layer (HTL) and/or an electron blocking layer may be provided between the first semiconductor layer 123b and the light-emitting layer 123a.

In some embodiments, as shown in FIG. 2J, first electrodes 121 are closer to the substrate 11 than second electrodes 122 are. The first electrode 121 includes a first pattern X1 and a second pattern X2 that are disposed in a same layer, and a bandgap of a material of the first pattern X1 is different from a bandgap of a material of the second pattern X2.

The bandgap is a difference between energy of the lowest point of a conduction band and energy of the highest point of a valence band, and is also referred to as an energy gap. The larger the bandgap, the harder the electrons are excited from the valence band to the conduction band, the lower the intrinsic carrier concentration, and the lower the conductivity.

Considering an example where the first electrode 121 is a cathode, the bandgap of the material of the first pattern X1 may be smaller than the bandgap of the material of the second pattern X2. In this case, compared to the second pattern X2, electrons in the first pattern X1 are more easily to be excited from the valence band to the conduction band, the intrinsic carrier (electron) concentration is higher, and the conductivity is higher. In this case, a work function of the material of the first pattern X1 is smaller than a work function of the material of the second pattern X2.

Considering an example where the first electrode 121 is an anode, the bandgap of the material of the first pattern X1 may be greater than the bandgap of the material of the second pattern X2. In this case, compared to the first pattern X1, electrons in the second pattern X2 are more easily to be excited from the valence band to the conduction band, the intrinsic carrier (hole) concentration is higher, and the conductivity is higher. In this case, the work function of the material of the first pattern X1 is greater than the work function of the material of the second pattern X2.

In some embodiments, the material of the second pattern X2 and the material of the first semiconductor layer 123b are the same.

In these embodiments, considering an example in which the first electrode 121 is the cathode and the first semiconductor layer 123b is the electron transport layer, the material of the second pattern X2 are the same as the material of the electron transport layer. Considering an example in which the first electrode 121 is the anode and the first semiconductor layer 123b is the hole transport layer, the material of the second pattern X2 are the same as the material of the hole transport layer.

Some embodiments of the present disclosure provide a driving method for the above-mentioned light-emitting apparatus. The driving method includes the following step.

In a light-emitting period of a light-emitting device 12 included in the light-emitting apparatus, applying a first voltage to a first electrode 121 of the light-emitting device 12 and applying a third voltage to a second electrode 122 of the light-emitting device 12, so as to drive the light-emitting device 12 to emit light.

Considering an example in which the carriers are electrons, a negative voltage or a grounding voltage may be applied to the first electrode 121 of the light-emitting device 12, and a positive voltage may be applied to the second electrode 122 of the light-emitting device 12, so as to drive the light-emitting device 12 to emit light.

In practical applications, a pixel driving circuit may be used to apply the negative voltage or the grounding voltage to the first electrode 121 of the light-emitting device 12 and to apply the positive voltage to the second electrode 122 of the light-emitting device 12 according to a timing control instruction.

The beneficial technical effects of the driving method for the light-emitting apparatus provided by embodiments of the present disclosure are the same as that of the light-emitting substrate provided by embodiments of the present disclosure, and will not be repeated here.

In some embodiments, the light-emitting device 12 further includes the electrode 124. The driving method further includes the following step.

In the light-emitting period of the light-emitting device 12, applying a second voltage to the third electrode 124 to adjust an effective width of the first electrode 121. The effective width of the first electrode 121 is a width of a conductive path that the first electrode 121 is capable of providing for carriers injection into the light-emitting layer 123a included in the light-emitting device 12.

In these embodiments, the second voltage is applied to the third electrode 124 to adjust the thickness of the space charge region F generated by the third electrode 124 and the first semiconductor layer 123b, so that the effective width of the first electrode 121 may be adjusted, and the carrier injection may thereby be adjusted.

In some embodiments, the carriers are electrons, the second voltage is a negative voltage, and an absolute value of the second voltage is smaller than an absolute value of the first voltage.

For example, considering an example in which the first voltage is the grounding voltage and may be, for example, 0 V, the second voltage may be a negative voltage; and considering an example in which the first voltage is the negative voltage and may be, for example, −1 V, the second voltage may be −2 V, −3 V or −4 V. Of course, in order to adjust the thickness of the space charge region F, the second voltage may be a variable voltage. In this case, if the first voltage is 0 V, the second voltage may vary from −1 V to −5 V, and if the first voltage is −1 V, the second voltage may vary from −2 V to −5 V.

In some other embodiments, the carriers are holes, the second voltage is a positive voltage, and the absolute value of the second voltage is greater than the absolute value of the first voltage.

For example, considering an example in which the first voltage is the grounding voltage and may be, for example, 0 V, the second voltage may be a positive voltage; and considering an example in which the first voltage is the positive voltage and may be, for example, 1 V, the second voltage may be 2V, 3V or 4V. Of course, in order to adjust the thickness of the space charge region F, the second voltage may be a variable voltage. In this case, if the first voltage is 0 V, the second voltage may vary from 1 V to 5 V, and if the second voltage is 1 V, the second voltage may vary from 2 V to 5 V.

Some embodiments of the present disclosure provide a method for manufacturing a light-emitting substrate. As shown in FIGS. 2A to 2J, the method includes the following step.

A plurality of sub-pixels P are formed on a substrate 11. Each sub-pixel P includes a light-emitting device 12, the light-emitting device 12 includes a first electrode 121 and a second electrode 122, and a light-emitting functional layer 123 formed between the first electrode 121 and the second electrode 122. The light-emitting functional layer 123 includes a light-emitting layer 123a, a first semiconductor layer 123b formed between the light-emitting layer 123a and the first electrode 121 and in contact with the first electrode 121, and a second semiconductor layer 123c formed between the light-emitting layer 123a and the second electrode 122. In the light-emitting device 12, a hollow K is formed in a portion of the first electrode 121 in contact with the first semiconductor layer 123b. The hollow K is located in a region where a sub-pixel P to which the light-emitting device 12 belongs is located, so that carriers injected into the light-emitting layer 123a by the first electrode 121 are reduced. The light-emitting device 12 is a light-emitting device 12 included in any sub-pixel P of the plurality of sub-pixels P.

The beneficial technical effects of the method for manufacturing the light-emitting substrate provided by embodiments of the present disclosure are the same as that of the light-emitting substrate, and will not be repeated here.

In some embodiments, forming the plurality of sub-pixels P on the substrate 11 may include the following step.

First electrodes 121 included in a plurality of light-emitting devices 12 are each formed in a region where each sub-pixel P is located on the substrate 11 through a patterning process, so as to form a hollow K in the first electrode 121 included in the light-emitting device 12 and in the region where the sub-pixel P to which the first electrode 121 belongs is located.

Depending on whether the first electrodes 121 are closer to or further away from the substrate 11 than the second electrodes 122 are, there are two cases for forming the first electrodes 121 included in the plurality of light-emitting devices 12 each in the region where each sub-pixel P is located on the substrate 11 through the patterning process.

In a first case, the first electrodes 121 are closer to the substrate 11 than the second electrodes 122 are. In this case, the first electrodes 121 included in the plurality of light-emitting devices 12 are each formed in the region where each sub-pixel P is located on the substrate 11 through the patterning process before the formation of the pixel defining layer 13. In this case, after the pixel defining layer 13 is formed, the first semiconductor layer 123b may be formed by a vapor deposition process, a sputtering process or a spin coating process, and the first semiconductor layer 123b is filled in the hollow K of the first electrode 121 included in the light-emitting device 12.

In a second case, the first electrodes 121 are further away from the substrate 11 than the second electrodes 122 are. In this case, the first electrodes 121 included in the plurality of light-emitting devices 12 are each formed in the region where each sub-pixel P is located on the substrate 11 through the patterning process after the formation of the first semiconductor layer 13. The first semiconductor layer 13 may also be formed by the vapor deposition process, the sputtering process or the spin coating process.

In some embodiments, forming the first electrodes 121 included in all the light-emitting devices 12 each in the region where each sub-pixel P is located on the substrate 11 through the patterning process may include:

covering some regions by a mask, and forming the first electrodes 121 included in all the light-emitting devices 12 on the substrate 11 through an evaporation process under the cover of the mask. The mask may have the same patterns as the first electrodes 121 included in all the light-emitting devices 12, and the first electrodes 121 included in all the light-emitting devices 12 may be formed on the substrate 11 through the evaporation under the cover of the mask.

In a case where the first electrodes 121 are closer to the substrate 11 than the second electrodes 122 are, a first electrode 121 included in a light-emitting device 12 may have a comb shape, and first electrodes 121 included in other light-emitting devices 12 may have a rectangular shape. In a case where the first electrodes 121 are further away from the substrate 11 than the second electrodes 122 are, the first electrodes 121 included in all the light-emitting devices 12 may be a whole layer, and hollows K are formed only in the active light-emitting regions of the light-emitting devices 12, so as to form the first electrodes 121 included in the light-emitting devices 12.

In some other embodiments, forming the first electrodes 121 included in all the light-emitting devices 12 each in the region where each sub-pixel P is located on the substrate 11 through the patterning process may include:

forming a conductive film by a deposition process, and then forming the first electrodes 121 included in all the light-emitting devices 12 by a exposure process, a development process and an etching process.

In a case where the first electrodes 121 are closer to the substrate 11 than the second electrodes 122 are, by a exposure process, a development process and an etching process, a portion of the conductive film located in the region where the light-emitting device 12 is located may be partially removed, and a portion of the conductive film located between regions where any two adjacent light-emitting devices 12 are located may be removed, so that the first electrodes 121 included in all the light-emitting devices 12 are formed. In a case where the first electrodes 121 are further away from the substrate 11 than the second electrodes 122 are, portions of the conductive film located in the regions where the light-emitting devices 12 are located may each be partially removed by the exposure process, the development process and the etching process, so as to form the hollows K in the first electrodes 121 included in all the light-emitting devices 12.

In some embodiments, in a case where the light-emitting substrate 1 further includes the third electrode 124, the manufacturing method further includes: forming the third electrode 124.

As to the manufacturing method for the third electrode 124, reference may be made to the manufacturing method for the first electrode 121, and details will not be repeated here. That is, the third electrode 124 may be formed by the mask and the evaporation process; alternatively, the third electrode 124 may be formed by the exposure process, the development process and the etching process.

The sequence of the formation of the first electrode 121 and the formation of the third electrode 124 is not limited here. The third electrode 124 may be formed after the first electrode 121 is formed. Alternatively, the first electrode 121 may be formed after the third electrode 124 is formed.

In addition, in a case where the second shank-shaped sub-electrode 124b included in the third electrode 124 is in ohmic contact with the first semiconductor layer 123b, the second shank-shaped sub-electrode 124b and the first electrode 121 may be formed by a same patterning process.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising:
a substrate; and
a plurality of sub-pixels disposed on the substrate; each sub-pixel including a light-emitting device; the light-emitting device including a first electrode and a second electrode, and a light-emitting functional layer disposed between the first electrode and the second electrode; and the light-emitting functional layer including a light-emitting layer, a first semiconductor layer disposed between the light-emitting layer and the first electrode and in contact with the first electrode, and a second semiconductor layer disposed between the light-emitting layer and the second electrode; the first electrode being configured to provide carriers for the light-emitting layer, wherein
in the light-emitting device, a portion of the first electrode in contact with the first semiconductor layer is provided with a hollow therein, and the hollow is located in a region where a sub-pixel to which the light-emitting device belongs is located.

2. The light-emitting substrate according to claim 1, wherein
an area of the first electrode included in the light-emitting device is smaller than an area of the light-emitting layer included in the light-emitting device; and/or
the first electrode is in ohmic contact with the first semiconductor layer; and/or
a material of the first semiconductor layer is a metal oxide semiconductor material; and/or
a material of the light-emitting layer is a quantum dot light-emitting material.

3. The light-emitting substrate according to claim 1, wherein
the carriers provided by the first electrode are electrons; and
a work function of a material of the first electrode is smaller than a work function of a material of the first semiconductor layer; or
the carriers provided by the first electrode are electrons; the work function of the material of the first electrode is smaller than the work function of the material of the first semiconductor layer; the material of the first electrode is selected from at least one of silver or aluminum, and the material of the first semiconductor layer is selected from at least one of zinc oxide (ZnO), zinc magnesium oxide (ZnMgO), titanium dioxide ($TiO_2$), tin dioxide ($SnO_2$) or zinc tin oxide (ZnSnO).

4. The light-emitting substrate according to claim 1, wherein
the carriers provided by the first electrode are holes; and
a work function of a material of the first electrode is greater than a work function of a material of the first semiconductor layer; or
the carriers provided by the first electrode are holes; the work function of the material of the first electrode is greater than the work function of the material of the first semiconductor layer; the material of the first electrode is selected from at least one of indium tin oxide (ITO), indium zinc oxide (IZO), palladium or platinum, and the material of the first semiconductor layer is selected from at least one of nickel oxide (NiO), tungsten trioxide ($WO_3$) or molybdenum oxide ($MoO_x$).

5. The light-emitting substrate according to claim 1, wherein
further comprising a third electrode disposed in the hollow, wherein
the third electrode and the first electrode have a gap therebetween, and the third electrode is in Schottky contact with the first semiconductor layer; and the third electrode is configured to receive a second voltage; and the second voltage is configured to adjust an effective width of the first electrode, the effective width of the first electrode is a width of a conductive path that the first electrode is capable of providing for the carriers injection into the light-emitting layer.

6. The light-emitting substrate according to claim 5, wherein
the carriers provided by the first electrode are electrons, and a work function of a material of the third electrode is greater than a work function of a material of the first semiconductor layer;
or
the carriers provided by the first electrode are holes, and the work function of the material of the third electrode is smaller than the work function of the material of the first semiconductor layer.

7. The light-emitting substrate according to claim 5, wherein
the first electrode included in the light-emitting device includes a plurality of first tooth-shaped sub-electrodes arranged at intervals sequentially in a first direction, the first direction is parallel to a plane where the substrate is located; the plurality of first tooth-shaped sub-electrodes are configured to receive a first voltage, and the hollow is provided between any two adjacent first tooth-shaped sub-electrodes; the third electrode includes a plurality of second tooth-shaped sub-electrodes arranged at intervals sequentially in the first direction; each second tooth-shaped sub-electrode is located between two adjacent first tooth-shaped sub-electrodes, or each first tooth-shaped sub-electrode is located between two adjacent second tooth-shaped sub-electrodes; and each second tooth-shaped sub-electrode and any first tooth-shaped sub-electrode adjacent to the second tooth-shaped sub-electrode have a first gap therebetween, the first gap belongs to the gap.

8. The light-emitting substrate according to claim 7, wherein
a width of a first tooth-shaped sub-electrode in the first direction and a width of a second tooth-shaped sub-electrode in the first direction are both smaller than 100 µm, and the first gap is smaller than 10 µm.

9. The light-emitting substrate according to claim 7, wherein
the plurality of first tooth-shaped sub-electrodes are each in a strip shape and extend in a second direction, the plurality of second tooth-shaped sub-electrodes are each in another strip shape and extend in the second direction, the second direction is parallel to the plane where the substrate is located and perpendicular to the first direction; or
the plurality of first tooth-shaped sub-electrodes are each in the strip shape and extend in the second direction, the plurality of second tooth-shaped sub-electrodes are each in the another strip shape and extend in the second direction, the second direction is parallel to the plane where the substrate is located and perpendicular to the first direction; the first electrode further includes a first shank-shaped sub-electrode, the first shank-shaped sub-electrode is disposed at a side of the plurality of first tooth-shaped sub-electrodes in the second direction and in contact with ends of the plurality of first tooth-shaped sub-electrodes proximate to the first shank-shaped sub-electrode; the first shank-shaped sub-electrode is configured to receive the first voltage, so as to provide the plurality of first tooth-shaped sub-electrodes with the first voltage; the third electrode further includes a second shank-shaped sub-electrode, the second shank-shaped sub-electrode is disposed at a side of the plurality of second tooth-shaped sub-electrodes in the second direction and in contact with ends of the plurality of second tooth-shaped sub-electrodes proximate to the second shank-shaped sub-electrode; the second shank-shaped sub-electrode is configured to receive the second voltage, so as to provide the third electrode with the second voltage.

10. The light-emitting substrate according to claim 9, wherein
the second shank-shaped sub-electrode and the first shank-shaped sub-electrode are respectively located at two opposite sides of both the plurality of first tooth-shaped sub-electrodes and the plurality of second tooth-shaped sub-electrodes in the second direction; the second shank-shaped sub-electrode and the ends of the plurality of first tooth-shaped sub-electrodes away from the first shank-shaped sub-electrode each have a second gap therebetween; and the first shank-shaped sub-electrode and the ends of the plurality of second tooth-shaped sub-electrodes away from the second shank-shaped sub-electrode each have a third gap therebetween; or
the second shank-shaped sub-electrode and the first shank-shaped sub-electrode are respectively located at two opposite sides of both the plurality of first tooth-shaped sub-electrodes and the plurality of second tooth-shaped sub-electrodes in the second direction; the second shank-shaped sub-electrode and the ends of the plurality of first tooth-shaped sub-electrodes away from the first shank-shaped sub-electrode each have the second gap therebetween; the first shank-shaped sub-electrode and the ends of the plurality of second tooth-shaped sub-electrodes away from the second shank-shaped sub-electrode each have the third gap therebetween; the second gap is larger than or equal to 1 µm and smaller than or equal to 10 µm, and the third gap is larger than or equal to 1 µm and smaller than or equal to 10 µm.

11. The light-emitting substrate according to claim 1, wherein
the first electrode is closer to the substrate than the second electrode is; the hollow is filled with a semiconductor material, and the semiconductor material is same as a material of the first semiconductor layer;
or
the first electrode is further away from the substrate than the second electrode is.

12. A light-emitting substrate, comprising:
a substrate; and
a plurality of sub-pixels disposed on the substrate; each sub-pixel including a light-emitting device; the light-emitting device including a first electrode and a second electrode, and a light-emitting functional layer disposed between the first electrode and the second electrode, wherein
the first electrode is closer to the substrate than the second electrode is, the first electrode includes a first pattern and a second pattern that are disposed in a same layer, and a bandgap of a material of the first pattern is different from a bandgap of a material of the second pattern.

13. A light-emitting apparatus comprising the light-emitting substrate according to claim 1.

14. A driving method for the light-emitting apparatus according to claim 13, comprising:
  in a light-emitting period of the light-emitting device in the light-emitting substrate included in the light-emitting apparatus, applying a first voltage to the first electrode of the light-emitting device and applying a third voltage to the second electrode of the light-emitting device, so as to drive the light-emitting device to emit light.

15. The driving method for the light-emitting apparatus according to claim 14, wherein
  the light-emitting device further includes a third electrode, and the driving method further comprises:
  in the light-emitting period of the light-emitting device, applying a second voltage to the third electrode to adjust an effective width of the first electrode, the effective width of the first electrode being a width of a conductive path that the first electrode is capable of providing for the carriers injection into the light-emitting layer included in the light-emitting device.

16. The driving method for the light-emitting apparatus according to claim 15, wherein
  the carriers provided by the first electrode are electrons, the second voltage is a negative voltage, and an absolute value of the second voltage is smaller than an absolute value of the first voltage;
  or
  the carriers provided by the first electrode are holes, the second voltage is a positive voltage, and the absolute value of the second voltage is greater than the absolute value of the first voltage.

17. A method for manufacturing a light-emitting substrate, comprising:
  forming a plurality of sub-pixels on a substrate, wherein each sub-pixel includes a light-emitting device, the light-emitting device includes a first electrode and a second electrode, and a light-emitting functional layer formed between the first electrode and the second electrode, the light-emitting functional layer includes a light-emitting layer, a first semiconductor layer formed between the light-emitting layer and the first electrode and in contact with the first electrode, and a second semiconductor layer formed between the light-emitting layer and the second electrode, wherein
  in the light-emitting device, a hollow is formed in a portion of the first electrode in contact with the first semiconductor layer, and the hollow is located in a region where a sub-pixel to which the light-emitting device belongs is located.

18. The method for manufacturing the light-emitting substrate according to claim 17, wherein
  forming the plurality of sub-pixels on the substrate includes:
  forming first electrodes included in all light-emitting devices each in a region where each sub-pixel is located on the substrate through a patterning process, so as to form a hollow in the first electrode included in the light-emitting device and in the region where the sub-pixel to which the first electrode belongs is located.

19. A light-emitting apparatus comprising the light-emitting substrate according to claim 12.

20. A driving method for the light-emitting apparatus according to claim 19, comprising:
  in a light-emitting period of the light-emitting device in the light-emitting substrate included in the light-emitting apparatus, applying a first voltage to the first electrode of the light-emitting device and applying a third voltage to the second electrode of the light-emitting device, so as to drive the light-emitting device to emit light.

* * * * *